United States Patent
Watanabe et al.

(10) Patent No.: US 11,735,529 B2
(45) Date of Patent: Aug. 22, 2023

(54) SIDE PAD ANCHORED BY NEXT ADJACENT VIA

(71) Applicant: International Business Machines Corporation, Armonk, NY (US)

(72) Inventors: Takahito Watanabe, Yokohama (JP); Risa Miyazawa, Isehara (JP); Hiroyuki Mori, Yasu (JP)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 17/326,906

(22) Filed: May 21, 2021

(65) Prior Publication Data

US 2022/0375867 A1 Nov. 24, 2022

(51) Int. Cl.
  *H01L 23/538* (2006.01)
  *H01L 23/498* (2006.01)
  (Continued)

(52) U.S. Cl.
  CPC ...... *H01L 23/5386* (2013.01); *H01L 21/4857* (2013.01); *H01L 23/49805* (2013.01);
  (Continued)

(58) Field of Classification Search
  CPC .................. H01L 23/5386; H01L 23/5381
  See application file for complete search history.

(56) References Cited

U.S. PATENT DOCUMENTS

| | | | |
|---|---|---|---|
| 5,241,456 A | 8/1993 | Marcinkiewicz et al. | |
| 5,422,310 A | 6/1995 | Ito | |

(Continued)

FOREIGN PATENT DOCUMENTS

| | | |
|---|---|---|
| CN | 101246933 A | 8/2008 |
| CN | 101409267 A | 4/2009 |

(Continued)

OTHER PUBLICATIONS

Lau, J. H., "Heterogeneous Integrations on Silicon Substrates (Bridges)," https://link.springer.com/chapter/10.1007/978-981-13-7224-7_4, Heterogeneous Integrations, https://doi.org/10.1007/978-981-13-7224-7_4, Apr. 2019, 27 pgs.

(Continued)

*Primary Examiner* — Selim U Ahmed
*Assistant Examiner* — Evan G Clinton
(74) *Attorney, Agent, or Firm* — Kelli D. Morin

(57) ABSTRACT

An integrated circuit package includes a substrate including at least one electrical connection to at least one of power or ground. The package further includes a bridge structure including at least one layer of conductive material and at least one layer of insulative material. The bridge structure is configured to be coupled to the substrate such that the conductive material is electrically connected to the at least one electrical connection. The bridge structure includes a side pad made of conductive material that is electrically connected to the at least one electrical connection. The side pad is in direct contact with the conductive material and with the insulative material of the bridge structure. The side pad forms an end face of the bridge structure such that the conductive material of the side pad is exposed.

19 Claims, 17 Drawing Sheets

(51) Int. Cl.
*H01L 23/00* (2006.01)
*H01L 21/48* (2006.01)
*H01L 25/065* (2023.01)

(52) U.S. Cl.
CPC .... *H01L 23/49811* (2013.01); *H01L 23/5381* (2013.01); *H01L 23/5385* (2013.01); *H01L 24/16* (2013.01); *H01L 25/0655* (2013.01); *H01L 2224/16227* (2013.01)

(56) References Cited

U.S. PATENT DOCUMENTS

| | | | |
|---|---|---|---|
| 5,452,182 A | 9/1995 | Eichelberger et al. | |
| 5,785,585 A | 7/1998 | Manfredi | |
| 5,910,341 A | 6/1999 | Fey | |
| 6,056,831 A | 5/2000 | Egitto | |
| 6,063,481 A | 5/2000 | Arrington | |
| 6,099,959 A | 8/2000 | Konrad | |
| 6,177,729 B1 | 1/2001 | Benenati | |
| 6,224,392 B1 | 5/2001 | Fasano | |
| 6,358,627 B2 | 3/2002 | Benenati | |
| 6,432,182 B1 | 8/2002 | Konrad | |
| 6,524,654 B1 | 2/2003 | Konrad | |
| 7,015,580 B2 | 3/2006 | Fitzsimmons | |
| 8,174,117 B2 | 5/2012 | Ishido | |
| 8,198,546 B2 | 6/2012 | Kawamura | |
| 8,901,431 B2 | 12/2014 | Nishioka | |
| 8,997,341 B2 | 4/2015 | Ejiri | |
| 9,240,382 B2 | 1/2016 | Hollis | |
| 9,324,557 B2 | 4/2016 | Cate | |
| 9,425,174 B1 | 8/2016 | Hin et al. | |
| 9,780,075 B2 | 10/2017 | Das et al. | |
| 9,786,588 B2 | 10/2017 | Kung | |
| 9,914,989 B2 | 3/2018 | Kay | |
| 10,163,798 B1 | 12/2018 | Alur et al. | |
| 10,197,423 B2 | 2/2019 | Bjerring | |
| 10,249,593 B2 | 4/2019 | Wickramanayaka et al. | |
| 10,361,170 B2 | 7/2019 | Pyo et al. | |
| 11,004,819 B2 | 5/2021 | Miyazawa et al. | |
| 2005/0112861 A1 | 5/2005 | Fitzsimmons | |
| 2008/0149369 A1 | 6/2008 | Kawamura | |
| 2009/0095514 A1 | 4/2009 | Kaneko | |
| 2012/0152600 A1 | 6/2012 | Nishioka | |
| 2012/0306104 A1 | 12/2012 | Choi et al. | |
| 2014/0145328 A1 | 5/2014 | Tummala et al. | |
| 2015/0014027 A1 | 1/2015 | Kaneko et al. | |
| 2016/0095219 A1 | 3/2016 | Sakamoto | |
| 2017/0045387 A1 | 2/2017 | Lindballe | |
| 2017/0053897 A1 | 2/2017 | Kwan-Yu | |
| 2017/0236724 A1 | 8/2017 | Chang et al. | |
| 2018/0182707 A1 | 6/2018 | Elsherbini et al. | |
| 2018/0190577 A1 | 7/2018 | Gupta | |
| 2019/0051603 A1 | 2/2019 | Horibe et al. | |
| 2019/0051605 A1 | 2/2019 | Horibe et al. | |
| 2019/0148250 A1 | 5/2019 | Yu et al. | |
| 2019/0363049 A1 | 11/2019 | Mekonnen et al. | |
| 2020/0100369 A1 | 3/2020 | Martin | |
| 2021/0098349 A1* | 4/2021 | Miyazawa | H01L 21/4846 |
| 2021/0098404 A1* | 4/2021 | Miyazawa | H01L 23/5386 |
| 2022/0199537 A1* | 6/2022 | Qian | H01L 23/5386 |

FOREIGN PATENT DOCUMENTS

| | | |
|---|---|---|
| CN | 101552211 A | 10/2009 |
| CN | 106298714 B | 1/2017 |
| CN | 109378308 A | 2/2019 |
| CN | 114342072 A | 4/2022 |
| DE | 112018003103 T5 | 3/2020 |
| JP | 2012209418 A | 10/2012 |
| KR | 102014008751 A | 1/2014 |
| KR | 1020140087541 A | 7/2014 |
| WO | 2019030617 A1 | 2/2019 |
| WO | 2021059047 A1 | 4/2021 |
| WO | 2021059052 A1 | 4/2021 |

OTHER PUBLICATIONS

List of IBM Patents or Patent Applications Treated as Related, May 21, 2021, 2 pgs.

Manessis et al., "Technical Understanding of Resin-Coated-Copper (RCC) Lamination Processes for Realization of Reliable Chip Embedding Technologies," Proceedings 57th Electronic Components and Technology Conference, Jun. 2007, pp. 278-285, ©2007 IEEE.

Miyazawa et al.,"Prevention of Bridging Between Solder Joints", U.S. Appl. No. 17/210,720, filed Mar. 24, 2021.

Watanabe et al.,"Fabricating an Interconnection Using a Sacrificial Layer," U.S. Appl. No. 17/308,176, filed May 5, 2021.

Anonymous, "How do I prevent bridges while soldering SMD Components?" Jul. 2017, 1 page, https://electronics.stackexchange.com/questions/1848/custom-led-assembly-manufacturing/3181#3181.

Anonymous, "Kawai Laboratory, Nano/Micro System Engineering Laboratory," Department of Electrical, Electronic and Information Engineering, Nagaoka University of Technology Electronic Device and Photonics Engineering Course, Sep. 2019, 56 pages, http://kawai.nagaokaut.ac.jp/miniseminar2.html.

International Search Report for PCT/IBM2020/057798 dated Nov. 22, 2020, 9 pgs.

International Search Report issued in International Application No. PCT/IBM2020/057965 dated Nov. 27, 2020, pp. 1-9.

Yamamoto, Michitaka, et al., "Comparison of Argon and Oxygen Plasma Treatments for Ambient Room-Temperature Wafer-Scale Au-Au Bonding Using Ultrathin Au Films," Micromachines, Feb. 2019, 12 pp. 10, 2.

* cited by examiner

SIDE PAD ANCHORED BY NEXT ADJACENT VIA

BACKGROUND

The present disclosure relates to microchip electronic packages. In particular, the present disclosure relates to packaging technology utilizing high density interconnections between chips.

There is growing demand for wide band signal transmission between interconnected microchips. One way to improve such transmission is with high density interconnections between microchips. Developing such high density interconnections requires managing challenges regarding mechanical stresses, fabrication, expense, and reliability.

SUMMARY

Embodiments of the present disclosure include an integrated circuit package. The integrated circuit package includes a substrate including at least one electrical connection to at least one of power or ground. The integrated circuit package further includes a bridge structure including at least one layer of conductive material and at least one layer of insulative material. The bridge structure is configured to be coupled to the substrate such that the at least one layer of conductive material is electrically connected to the at least one electrical connection of the substrate. The bridge structure includes a side pad made of conductive material that is electrically connected to the at least one electrical connection of the substrate. The side pad is in direct contact with the at least one layer of conductive material and with the at least one layer of insulative material of the bridge structure. The side pad forms an end face of the bridge structure such that the conductive material of the side pad is exposed.

Additional embodiments of the present disclosure include a bridge structure for use in an integrated circuit package. The bridge structure comprises at least one layer of conductive material configured to be electrically connected to at least one electrical connection of a substrate. The bridge structure further comprises at least one layer of insulative material. The bridge structure further comprises a side pad made of conductive material that is in direct contact with the at least one layer of conductive material and with the at least one layer of insulative material. The side pad forms an end face of the bridge structure such that the conductive material of the side pad is exposed.

Additional embodiments of the present disclosure include a method of forming a bridge structure for an integrated circuit package. The method comprises forming contact pads. The method further comprises forming ultra-high density circuitry that is electrically connected to the contact pads. The method further comprises exposing a side pad made of electrically conductive material. The side pad is integrally formed with the ultra-high density circuitry.

The above summary is not intended to describe each illustrated embodiment or every implementation of the present disclosure.

BRIEF DESCRIPTION OF THE DRAWINGS

The drawings included in the present disclosure are incorporated into, and form part of, the specification. They illustrate embodiments of the present disclosure and, along with the description, serve to explain the principles of the disclosure. The drawings are only illustrative of typical embodiments and do not limit the disclosure.

FIG. 7AA is a schematic diagram depicting a portion of a bridge following the performance of a portion of the method shown in FIG. 6, in accordance with embodiments of the present disclosure.

FIG. 7AB is a schematic diagram depicting a portion of a bridge following the performance of a portion of the method shown in FIG. 6, in accordance with embodiments of the present disclosure.

FIG. 7AC is a schematic diagram depicting a portion of a bridge following the performance of a portion of the method shown in FIG. 6, in accordance with embodiments of the present disclosure.

FIG. 7AD is a schematic diagram depicting a portion of a bridge following the performance of a portion of the method shown in FIG. 6, in accordance with embodiments of the present disclosure.

FIG. 7AE is a schematic diagram depicting a portion of a bridge following the performance of a portion of the method shown in FIG. 6, in accordance with embodiments of the present disclosure.

FIG. 7AF is a schematic diagram depicting a portion of a bridge following the performance of a portion of the method shown in FIG. 6, in accordance with embodiments of the present disclosure.

FIG. 7AG is a schematic diagram depicting a portion of a bridge following the performance of a portion of the method shown in FIG. 6, in accordance with embodiments of the present disclosure.

DETAILED DESCRIPTION

Figure 1:
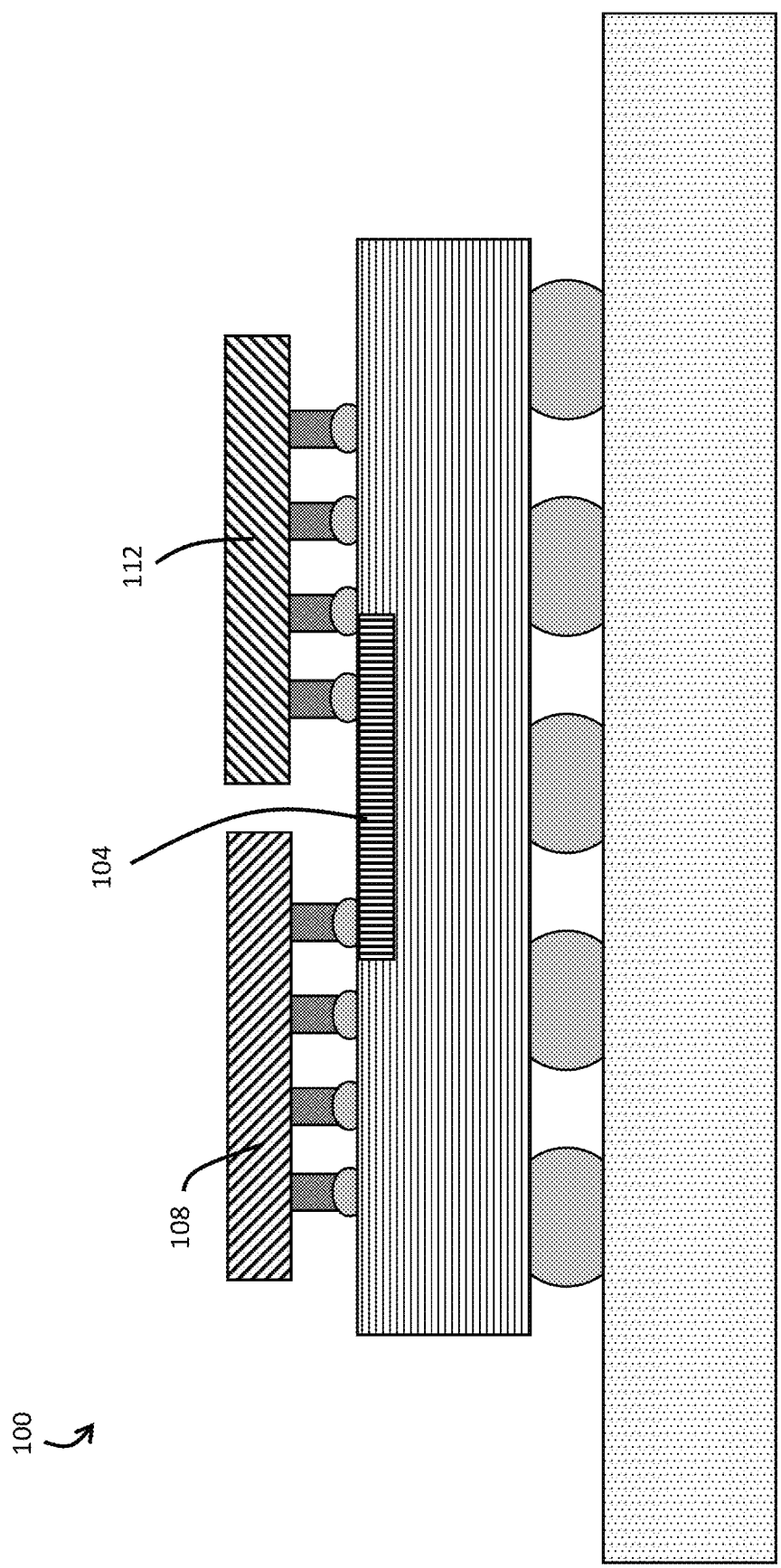
FIG. 1 is a schematic cross-section view of an electronic package, in accordance with embodiments of the present disclosure.

Aspects of the present disclosure relate generally to microchip electronic packages. In particular, the present disclosure relates to packaging technology utilizing high density interconnections between chips and methods of producing the same. While the present disclosure is not necessarily limited to such applications, various aspects of the disclosure may be appreciated through a discussion of various examples using this context.

Various embodiments of the present disclosure are described herein with reference to the related drawings. Alternative embodiments can be devised without departing from the scope of the present disclosure. It is noted that various connections and positional relationships (e.g., over, below, adjacent, etc.) are set forth between elements in the following description and in the drawings. These connections and/or positional relationships, unless specified otherwise, can be direct or indirect, and the present disclosure is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements. It should be noted, the term "selective to," such as, for example, "a first element selective to a second element," means that a first element can be etched, and the second element can act as an etch stop.

In microchip electronic packaging technology, ICs are put into protective packages to allow easy handling and assembly onto printed circuit boards and to protect the devices from damage. In flip chip systems, the IC is connected by solder bumps to a substrate.

Turning now to an overview of technologies that are more specifically relevant to aspects of the present disclosure, interconnection structures using an interconnection member attached to or embedded in an organic substrate have been developed for establishing interconnections between chips mounted thereon. Examples of such interconnection members disposed on the organic substrate include a silicon bridge and an organic layered interconnection. Use of such an interconnection member can restrict routing of wiring for connecting chips and for driving the chips. Terminal layout of the chips can also be restricted. For example, even though it is preferable to arrange the ground and power supply terminals of the chip at positions above the interconnection member, it is often difficult to route wiring from the power and ground terminals of the chip to external power supply and ground lines of the organic substrate.

A high-density interconnecting adhesive tape (HIAT) disclosed herein includes an interconnection substrate on which interconnected chips are mounted. The HIAT enables high density interconnections between the chips mounted on the interconnection substrate. In some embodiments, the HIAT may have a structure and function substantially similar to that disclosed in United States Patent Application Number 2021/0098349A1 (hereinafter US20210098349A1), which is incorporated by reference herein in its entirety, except for any definitions, subject matter disclaimers, or disavowals, and except to the extent that the incorporated material is inconsistent with the express disclosure herein, in which case the language in this disclosure controls. Moreover, in some embodiments, the HIAT may be fabricated by processes and/or using materials substantially similar to those disclosed in US20210098349A1.

FIG. 1 depicts a schematic cross-sectional view of a multi-flip chip electronic package 100 including a high-density interconnecting adhesive tape (HIAT) structure. HIAT technology relies on high density interconnections between chips that are mounted on an interconnection substrate. As shown, the resulting HIAT structure includes an organic bridge 104, which connects chips 108, 112 in a way that keeps the chips 108, 112 physically separated from one another. Furthermore, as discussed in further detail below, the HIAT structure is configured to enable heterogeneous integration and to directly receive power or a ground line from a laminate substrate.

The HIAT bridge 104 is particularly useful for graphics processing unit (GPU) or high-bandwidth memory (HBM) or separated artificial intelligence (AI) chips, which are relatively large. Accordingly, the package 100 is also relatively large due to its application. More specifically, a large package is necessary to control chip-package interactions with large chips. Chip-package interactions include, for example, warpage or other distortions due to mismatches between coefficients of thermal expansion of different interfacing materials such as organic materials, silicon, and copper. One way that such interactions can be managed is by silicon bridges. Silicon bridges enable high density circuitry, but also have greater chip-package interactions than the HIAT structure disclosed herein.

Figure 2:
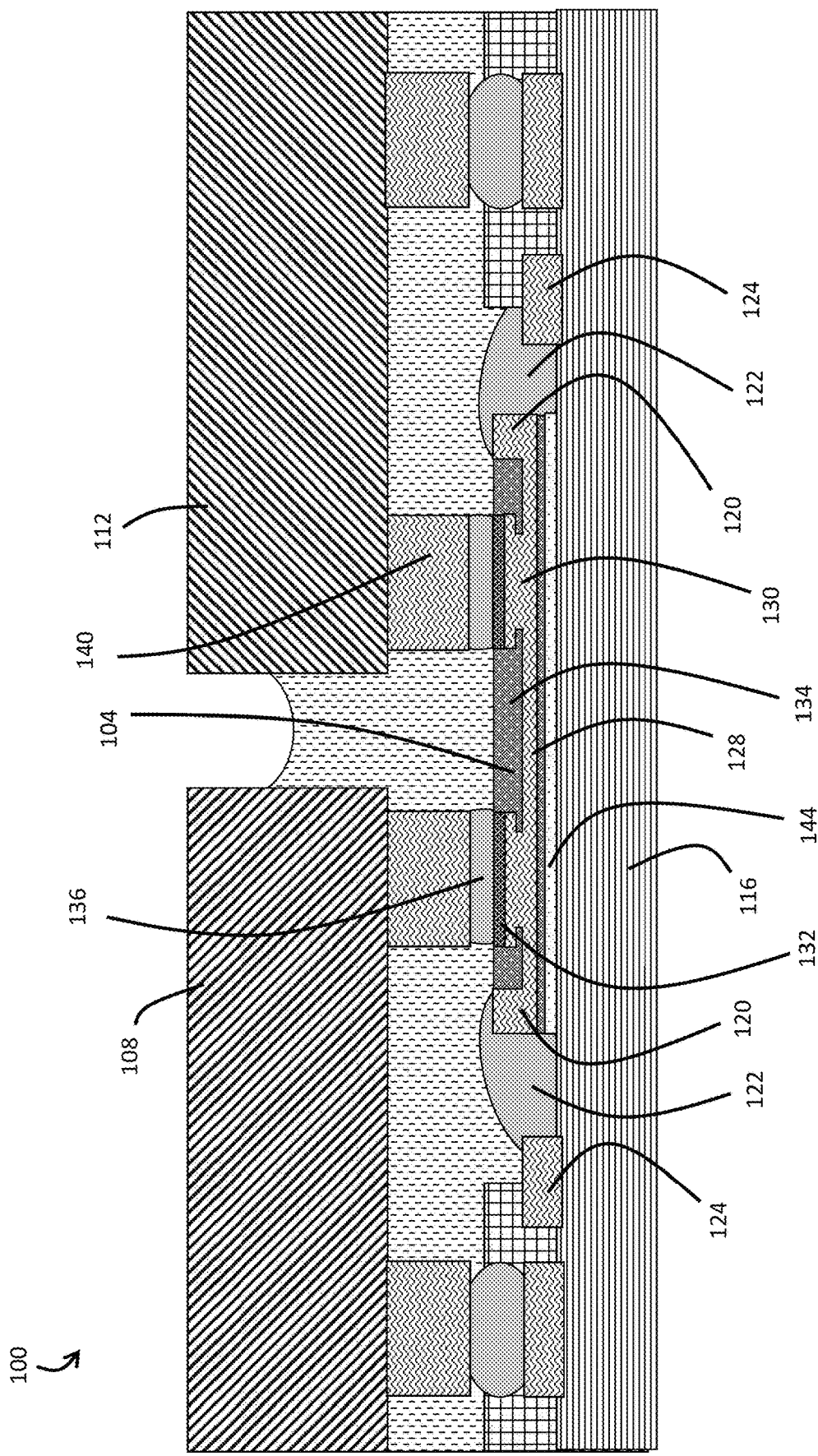
FIG. 2 is a schematic cross-section view of an electronic package including a bridge, in accordance with embodiments of the present disclosure.

FIG. 2 depicts a portion of the package 100 of FIG. 1 which more clearly shows the HIAT bridge 104. In particular, FIG. 2 shows side pads 120 of the HIAT bridge 104. These side pads 120 enable the heterogeneous integration and direct receipt of power or a ground line from the laminate substrate 116, mentioned above. In other words, the side pads 120 advantageously enable better power supply between chips. More specifically, without the side pads 120, in order to supply power between chips, the power must pass through a relatively long distance; from a first chip, through the laminate, to a second chip. This contributes to high power loss and limits the flexibility of laminate design. The side pads 120 overcome these drawbacks by removing the need for power to pass such long distances, because the side pads 120 provide the power directly from the laminate to the HIAT bridge 104, which is in direct conductive contact with both chips.

To this end, as shown in FIG. 2, one side of each side pad 120 of the HIAT bridge 104 is exposed to enable a lateral or side connection with a corresponding substrate pad 124 of the laminate substrate 116 by solder 122. In other words, each side pad 120 forms an end face of the HIAT bridge 104 such that the conductive material of the side pad 120 is exposed. In accordance with at least one embodiment of the present disclosure, the side pads 120 are made of copper. In such embodiments, the corresponding substrate pads 124 can also be made of copper. As described in further detail below, this arrangement subjects the side pads 120 to lateral stresses which tend to pull the side pads 120 outwardly from the HIAT bridge 104.

With continued reference to FIG. 2, the HIAT bridge 104 further comprises ultra-high density (UHD) circuitry 128. In accordance with at least one embodiment of the present disclosure, the UHD circuitry 128 can include bridge-chip interconnects 130 and one or more insulation layers 134. In accordance with at least one embodiment of the present disclosure, the bridge-chip interconnects 130 can include one or more conductive copper layers. In accordance with at least one embodiment of the present disclosure, the one or more insulation layers 134 can be made of an organic insulation material. In accordance with at least one embodiment of the present disclosure, the one or more insulation layers 134 can be or include a photo-sensitive resin. Accordingly, the one or more insulation layers 134 of the UHD circuitry 128 of the HIAT bridge 104 may also be referred to herein as resin. The side pads 120 are conductively connected to the bridge-chip interconnects 130 of the UHD circuitry 128.

The HIAT bridge 104 also includes conductive pads 132 that are connected to the bridge-chip interconnects 130 and that are configured to be further connected to the chips 108, 112 by solder 136 and interconnect pillars 140. In accordance with at least one embodiment of the present disclosure, the conductive pads 132 can be made of gold. In this way, the HIAT bridge 104 is connected to the chips 108, 112. Additionally, the HIAT bridge 104 is connected to the substrate 116 of the package 100 by an adhesive 144 that is applied to the side of the HIAT bridge 104 opposite the side that is connected to the chips 108, 112.

Figure 3A:
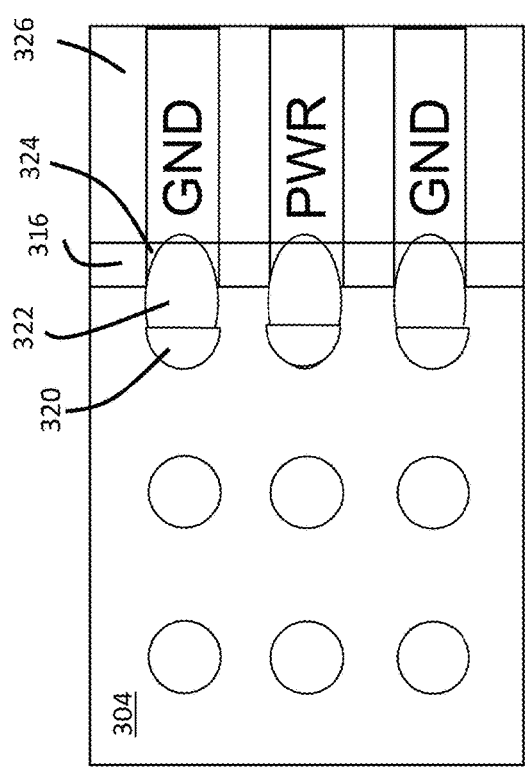
FIG. 3A is a top plan view of an example configuration of a bridge, such as that shown in FIG. 2, connected to a substrate, in accordance with embodiments of the present disclosure.
Figure 3B:
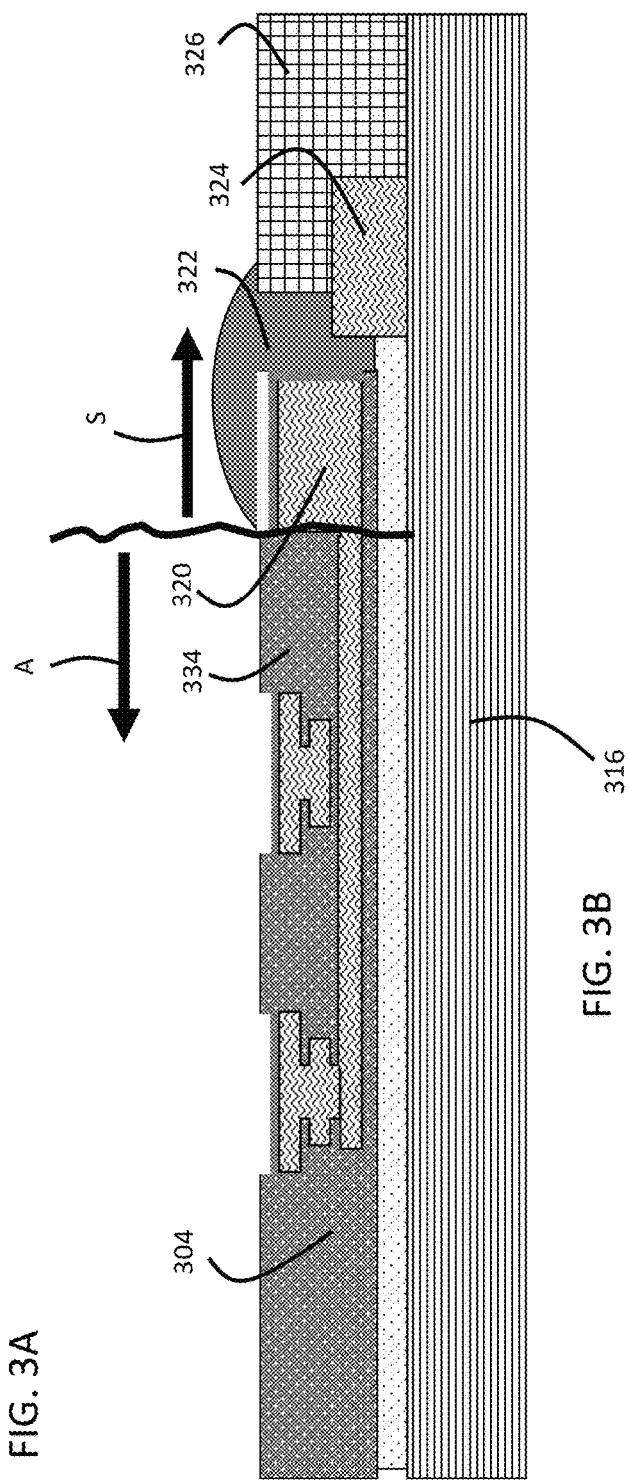
FIG. 3B is a schematic cross-section view of the example configuration shown in FIG. 3A, in accordance with embodiments of the present disclosure.

Turning now to FIGS. 3A and 3B, one embodiment of a HIAT bridge 304 and laminate substrate 316 is shown. The HIAT bridge 304 and laminate substrate 316 can be used in a package, such as package 100 described above. FIG. 3A illustrates the advantageous connection of the HIAT bridge 304 to the laminate substrate 316. As shown, the side pads 320 of the HIAT bridge 304 are connected to the corresponding substrate pads 324 by solder 322. The substrate pads 324 can provide a connection to ground (as indicated by GND) or power (as indicated by PWR). Such connections are provided in an area of solder resist 326. In at least one alternative embodiment (not shown), the side pad may not necessarily be connected to the ground or power line of the substrate.

As shown in FIG. 3B, the side pads 320 are subjected to lateral stresses S which tend to pull the side pads 320 outwardly from the HIAT bridge 304. Lateral stresses S can be caused by, for example, shrinkage of the solder 322 between the side pad 320 on the HIAT bridge 304 and the corresponding substrate pad 324 and solder resist 326 on the laminate substrate 316. Lateral stresses S can also be caused by, for example, shear forces applied on the side pad 320 during chip dicing processes.

In the arrangement shown in FIGS. 3A and 3B, the lateral stresses S are countered by an adhesive force A between the resin 334 and the side pad 320 and by the mechanical strength of the material of the side pad 320. This adhesive force A can be increased by performing a surface roughening treatment on at least one of the resin 334 and the side pad 320 to improve contact at the interface of the two materials. However, the application of the surface roughening treatment is limited because a rougher surface contributes to signal loss and because the contact area is decreased in the UHD circuitry layer. Accordingly, even when increased in this way, the adhesive force A may still be weaker than the lateral stresses S with the possible result of the side pad 320 being pulled out of the HIAT bridge 304.

Figure 4A:
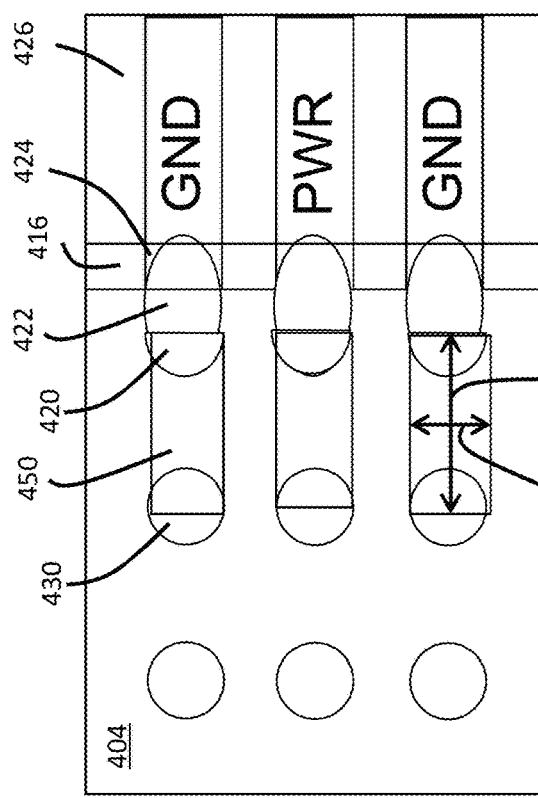
FIG. 4A is a top plan view of an example configuration of a bridge, such as that shown in FIG. 2, connected to a substrate, in accordance with embodiments of the present disclosure.
Figure 4B:
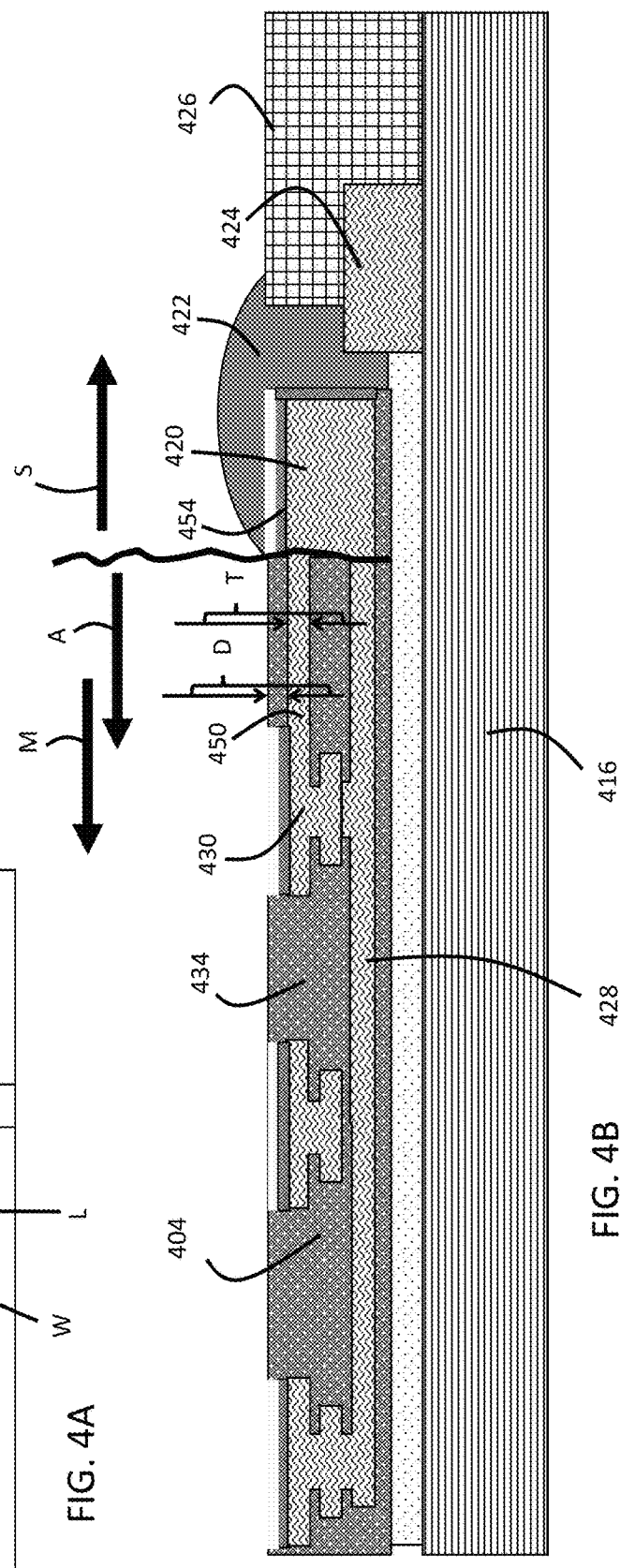
FIG. 4B is a schematic cross-section view of the example configuration shown in FIG. 4A, in accordance with embodiments of the present disclosure.

FIGS. 4A and 4B depict another embodiment of a HIAT bridge 404 and laminate substrate 416. In this embodiment, the HIAT bridge 404 is connected to the laminate substrate 416 in substantially the same manner as shown in FIGS. 3A and 3B and described above. In particular, the side pad 420 on the HIAT bridge 404 and the corresponding substrate pad 424 and solder resist 426 on the laminate substrate 416 are connected by the solder 422. However, the HIAT bridge 404 further includes an additional connection 450 extending inwardly from the side pad 420 into the HIAT bridge 404. In the embodiment shown in FIG. 4B, the additional connection 450 is arranged so as to extend in a direction substantially parallel to the other layer(s) of conductive material of the UHD circuitry 428. Additionally, the additional connection 450 is arranged such that it is separated by the other layer(s) of conductive material of the UHD circuitry 428 by a layer of insulative material of the UHD circuitry 428. In at least one embodiment of the present disclosure, the additional connection 450 extends between the side pad 420 and the next adjacent bridge-chip interconnect 430. More specifically, in at least one embodiment of the present disclosure, the additional connection 450 extends from the side pad 420 to the next adjacent bridge-chip interconnect 430.

Accordingly, the next adjacent bridge-chip interconnect 430 acts as an anchor which physically strengthens the connection of the side pad 420 to the HIAT bridge 404. In such embodiments, the lateral stresses S which tend to pull the side pads 420 outwardly from the HIAT bridge 404 are countered by the adhesive force A between the resin 434 and the side pad 420 as well as by the mechanical anchoring force M provided by the additional connection 450 and by the next adjacent bridge-chip interconnect 430. In other words, the mechanical anchoring force M is provided by increased physical integration of the side pad 420 with the UHD circuitry 428.

The additional connection 450 is integrally formed with the side pad 420. In embodiments wherein the additional connection 450 extends from the side pad 420 to the next adjacent bridge-chip interconnect 430, the additional connection 450 is integrally formed with the side pad 420 and the next adjacent bridge-chip interconnect 430.

To prevent the side pad 420 from being pulled out of the HIAT bridge 404, the combination of the adhesive force A and the mechanical anchoring force M must be stronger than the lateral stresses S. In accordance with at least one embodiment of the present disclosure, the mechanical anchoring force M is at least as great as the adhesive force A. In alternative embodiments, the mechanical anchoring force M may be greater than, equal to, or less than the adhesive force A. In all embodiments, the objective is for the combination of the adhesive force A and the mechanical anchoring force M to be greater than the lateral stresses S to prevent the side pad 420 from being pulled out of the HIAT bridge 404.

The mechanical anchoring force M can be tailored by manipulating the dimensions of the additional connection 450. In particular, the larger the width W (shown in FIG. 4A) and thickness T (shown in FIG. 4B) dimensions of the additional connection 450, the greater the mechanical anchoring force M. Additionally, the smaller the length L (shown in FIG. 4A) dimension of the additional connection 450, the greater the mechanical anchoring force M.

In accordance with at least one embodiment of the present disclosure, the width W of the additional connection 450 can be, for example, approximately 20 micrometers. In accordance with at least one alternative embodiment of the present disclosure, the width W of the additional connection 450 can be, for example, approximately 10 micrometers. In alternative embodiments, the width W of the additional connection 450 can be a width other than approximately 20 micrometers or approximately 10 micrometers that is selected to take into consideration providing appropriate insulative spacing between the additional connection 450 and surrounding conductive structures and the diameters of the side pad 420 and the next adjacent bridge-chip interconnect 430.

More specifically, the width W of the additional connection 450 is equal to or smaller than the diameters of the side pad 420 and the next adjacent bridge-chip interconnect 430 to which the additional connection 450 is connected. In accordance with at least some embodiments, wherein such diameter is between approximately 10 micrometers and approximately 40 micrometers, the width W can be in a range of approximately 1 micrometer to approximately 40 micrometers.

In accordance with at least one embodiment of the present disclosure, the thickness T of the additional connection 450 can be, for example, approximately 10 micrometers. In accordance with at least one alternative embodiment of the present disclosure, the thickness T of the additional connection 450 can be, for example, approximately 5 micrometers. In alternative embodiments, the thickness T of the additional connection 450 can be a thickness other than approximately 10 micrometers or approximately 5 micrometers that is selected to take into consideration providing appropriate insulation above the additional connection 450 and providing appropriate insulative spacing between the additional connection 450 and surrounding conductive structures.

More specifically, the additional connection 450 may be formed from a copper wire. In such embodiments, the thickness T of the additional connection 450 is substantially similar to the width W of the additional connection 450. Accordingly, in at least some embodiments, the thickness T can be in a range of approximately 1 micrometer to approximately 40 micrometers. However, given practical constraints, such as the total thickness of the HIAT bridge 404, the thickness T can be in a more limited range of approximately 1 micrometer to approximately 10 micrometers.

In accordance with at least one embodiment of the present disclosure, the length L of the additional connection 450 can be, for example, approximately 40 micrometers. In such embodiments, the length L of the additional connection 450 can be measured from the center of the side pad 420 to the center of the next adjacent bridge-chip interconnect 430. The length L of the additional connection 450 corresponds to the pitch between the center of the side pad 420 and the center of the next adjacent bridge-chip interconnect 430. Accordingly, in alternative embodiments, the length L can be a length other than approximately 40 micrometers that corresponds to an alternative pitch between the center of the side pad 420 and the center of the next adjacent bridge-chip interconnect 430.

More specifically, because the length L of the additional connection 450 corresponds to the pitch, and such pitches are typically in a range of approximately 20 micrometers to approximately 80 micrometers, the length L is also, correspondingly, in a range of approximately 20 micrometers to approximately 80 micrometers.

Additionally, the mechanical anchoring force M can also be tailored by manipulating the location of the additional connection 450 within the resin 434. In particular, the shallower the depth D (shown in FIG. 4B) at which the additional connection 450 is arranged, the greater the mechanical anchoring force M. In other words, the nearer the additional connection 450 is arranged relative to the top surface 454 of the side pad 420, the greater the mechanical anchoring force M, assuming that the side pad 420 is further connected to a conductive layer of the UHD circuitry 428 near the bottom surface of the side pad 420. Such arrangement provides greater mechanical anchoring force M due to the direction of the lateral stresses S that are caused by shrinkage of the solder 422 between the HIAT bridge 404 and the substrate 416 and by shear forces during chip dicing processes.

In accordance with at least one embodiment of the present disclosure, the depth D at which the additional connection 450 is arranged can be, for example, approximately 10 micrometers. In alternative embodiments, the depth D can be a depth other than approximately 10 micrometers that is selected by taking into consideration providing appropriate insulation above the additional connection 450 and providing appropriate distance from the other connections of the side pad 420 to the conductive layer of the UHD circuitry 428.

In accordance with at least one embodiment of the present disclosure, the depth D can be in a range of approximately 1 micrometer to approximately 10 micrometers. In general, the smaller (or "shallower" or "thinner") the depth D, the better. The depth D depends, at least in part, on the surface finishing thickness. In at least one embodiment of the present disclosure, the materials used for the finishing thickness are nickel and gold. In instances wherein such surface is finished by an electroplating process, the depth D can be in a range of approximately 3 micrometers to approximately 5 micrometers.

As mentioned above, to prevent the side pad 420 from being pulled out of the HIAT bridge 404, the combination of the adhesive force A and the mechanical anchoring force M must be stronger than the lateral stresses S. In accordance with at least one particular embodiment of the present disclosure, the total thickness of the HIAT bridge 404 is approximately 30 micrometers, and the diameter of the side pad 420 is approximately 20 micrometers. In the particular embodiment, the thickness T of the additional connection 450 is approximately 5 micrometers, and the width W is approximately 10 micrometers. In such an embodiment, the mechanical anchoring force M is approximately equal to the adhesive force A such that inclusion of the additional connection 450 approximately doubles the forces countering the lateral stresses S. In alternative embodiments, such as those having different relative dimensions, the additional connection 450 may provide a mechanical anchoring force M that is greater than or less than the adhesive force A.

Figure 5:
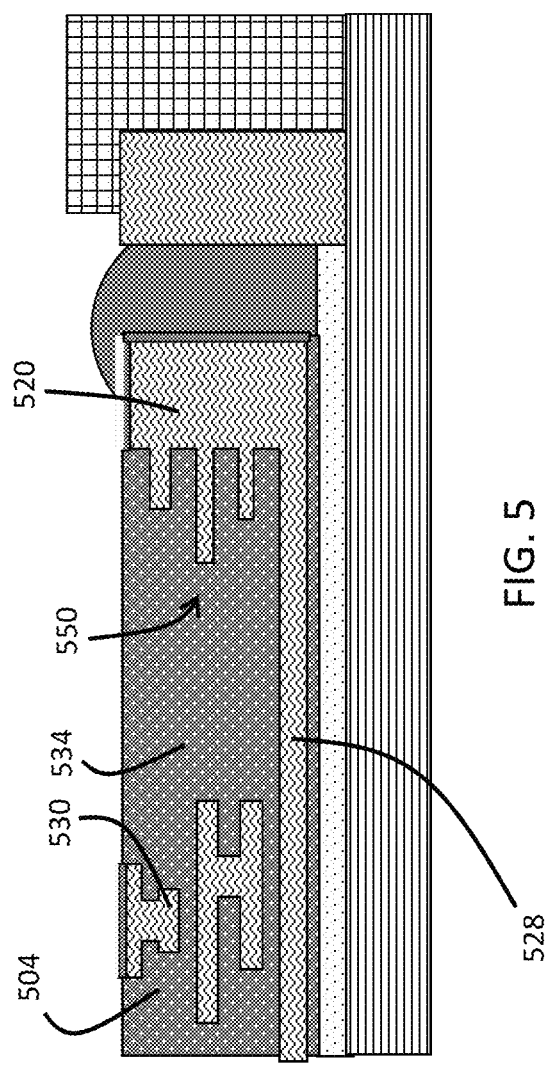
FIG. 5 is a schematic cross-section view of a bridge, such as that shown in FIG. 2, connected to a substrate, in accordance with embodiments of the present disclosure.

In one embodiment, shown in FIG. 5, the additional connection 550 does not extend all the way to the next adjacent bridge-chip interconnect 530. In some such embodiments, the additional connection 550 can comprise more than one structure that extends from the side pad 520 into the resin 534 of the HIAT bridge 504 in the direction toward the next adjacent bridge-chip interconnect 530. In such embodiments, the additional connection 550 still provides a mechanical anchoring force by providing additional surface area to increase physical integration of the side pad 520 with the UHD circuitry 528. In particular, in such embodiments, the side pad 520 is more physically integrated with the resin 534 of the UHD circuitry 528.

Figure 6:
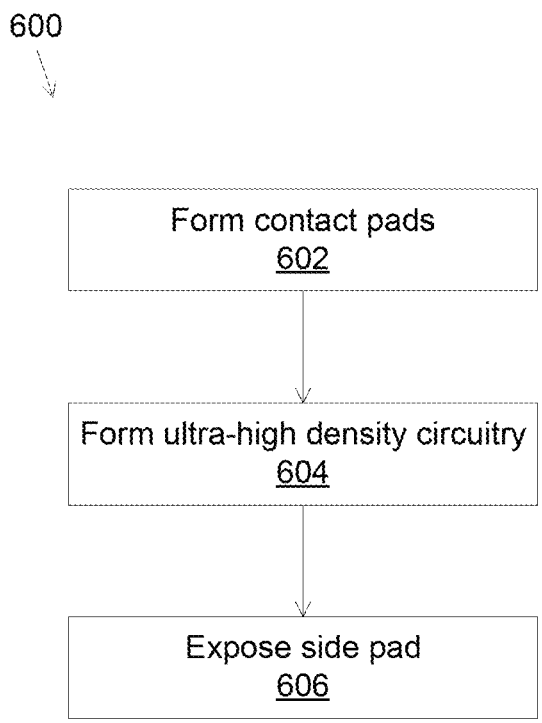
FIG. 6 depicts a flowchart of an example method of forming a bridge, such as that shown in FIG. 2, in accordance with embodiments of the present disclosure.
Figure 7A:
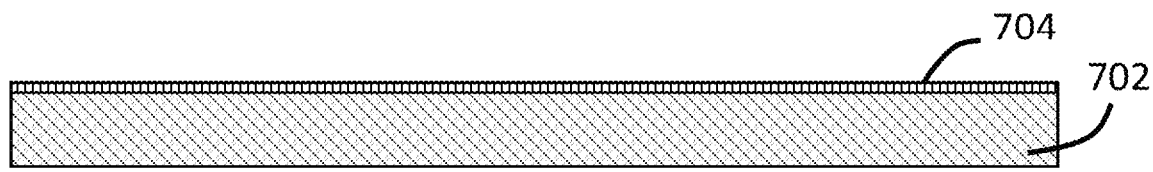
FIG. 7A is a schematic diagram depicting a portion of a bridge following the performance of a portion of the method shown in FIG. 6, in accordance with embodiments of the present disclosure.

FIG. 6 illustrates a flowchart for fabrication of a HIAT bridge such as that described above. The example method 600 begins at operation 602, wherein contact pads are formed. In accordance with at least one embodiment of the present disclosure, forming the contact pads at operation 602 can include forming a release layer on a carrier. Such an embodiment is illustrated in FIG. 7A, wherein the release layer 704 is formed on the carrier 702. In at least one embodiment of the present disclosure, the carrier is a glass wafer. In such embodiments, the glass wafer can have a thickness of, for example, approximately 700 micrometers. In at least one embodiment of the present disclosure, the release layer is a de-bond material that will ultimately facilitate the release of the HIAT bridge from the carrier. In at least one embodiment of the present disclosure, the release layer is formed on the carrier by spin coating.

Figure 7B:
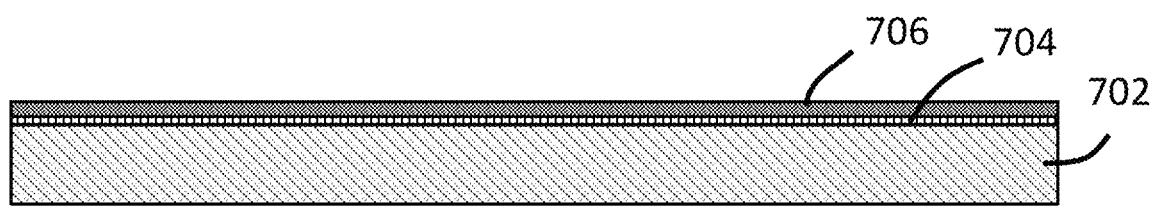
FIG. 7B is a schematic diagram depicting a portion of a bridge following the performance of a portion of the method shown in FIG. 6, in accordance with embodiments of the present disclosure.

In accordance with at least one embodiment of the present disclosure, forming the contact pads at operation 602 can further include forming a seed layer on the release layer. Such an embodiment is illustrated in FIG. 7B, wherein the seed layer 706 is formed on the release layer 704. In at least one embodiment of the present disclosure, the seed layer is formed on the release layer by sputtering. In at least one embodiment of the present disclosure, the seed layer can include a lower layer and an upper layer. In at least one embodiment of the present disclosure, the lower layer can be, for example, titanium, and/or the upper layer can be, for example, copper. In at least one embodiment of the present disclosure, the lower layer can have a thickness of, for example, approximately 50 nanometers, and/or the upper layer can have a thickness of, for example, approximately 300 nanometers.

Figure 7C:
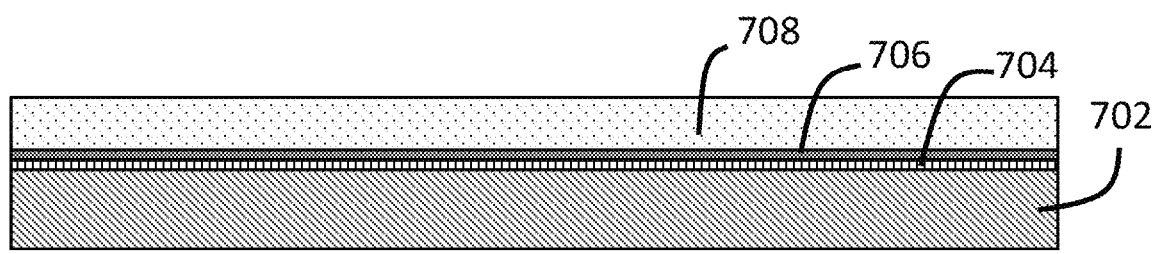
FIG. 7C is a schematic diagram depicting a portion of a bridge following the performance of a portion of the method shown in FIG. 6, in accordance with embodiments of the present disclosure.

In accordance with at least one embodiment of the present disclosure, forming the contact pads at operation 602 can further include forming a pattern resist on the seed layer. Such an embodiment is illustrated in FIG. 7C, wherein the pattern resist 708 is formed on the seed layer 706. In at least one embodiment of the present disclosure, the pattern resist can be formed by spin coating. In at least one embodiment of the present disclosure, the pattern resist can be applied as a film. In such embodiments, the pattern resist can be made by a lamination process. In at least one embodiment of the present disclosure, the pattern resist can be applied as a liquid. In at least one embodiment of the present disclosure, the pattern resist can have a thickness of, for example, between approximately 10 and approximately 60 micrometers.

Figure 7D:
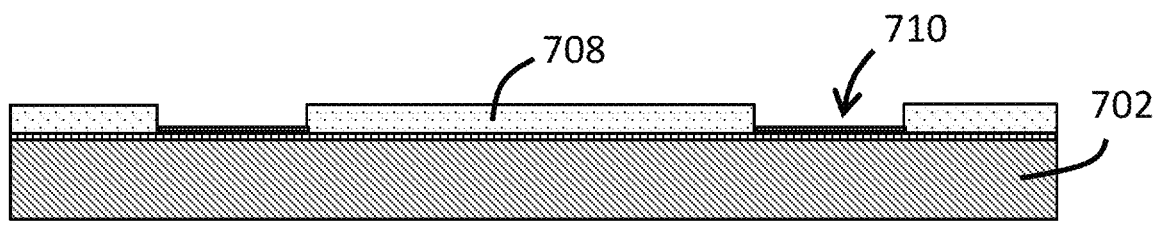
FIG. 7D is a schematic diagram depicting a portion of a bridge following the performance of a portion of the method shown in FIG. 6, in accordance with embodiments of the present disclosure.

In such embodiments, forming the contact pads at operation 602 can further include exposing and developing the pattern resist. Such an embodiment is illustrated in FIG. 7D, wherein the pattern resist 708 is exposed and developed to form openings 710 in the pattern resist 708. In at least one embodiment of the present disclosure, the pattern resist can be exposed and developed using positive masking. In at least one embodiment of the present disclosure, the pattern resist can be exposed and developed using negative masking.

Figure 7E:
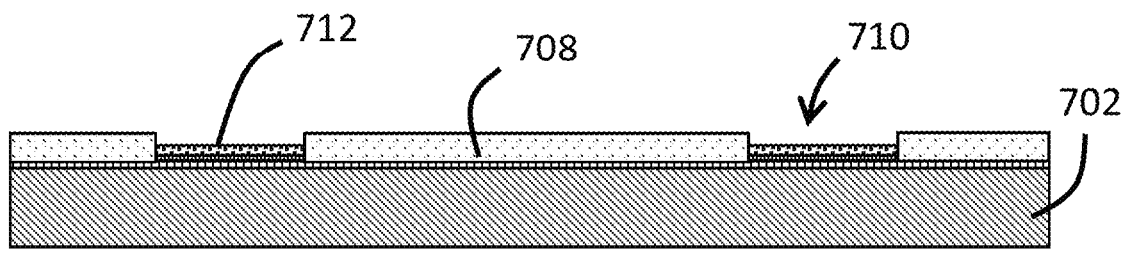
FIG. 7E is a schematic diagram depicting a portion of a bridge following the performance of a portion of the method shown in FIG. 6, in accordance with embodiments of the present disclosure.

In accordance with at least one embodiment of the present disclosure, forming the contact pads at operation 602 can further include forming the contact pads in the openings formed by exposing and developing the pattern resist. Such an embodiment is illustrated in FIG. 7E, wherein the contact pads 712 are formed in the openings 710. In at least one embodiment of the present disclosure, the contact pads are formed by electroplating metal materials. In at least one embodiment of the present disclosure, forming the contact pads includes electroplating a lower layer, a middle layer, and an upper layer. In such embodiments, the lower layer can be, for example, gold, and can have a thickness of, for example, between approximately 0.01 and approximately 0.1 micrometers. The middle layer can be, for example, palladium, and can have a thickness of, for example, between approximately 0 and approximately 1 micrometer. The upper layer can be, for example, nickel, and can have a thickness of, for example, between approximately 3 and approximately 5 micrometers. In at least one embodiment, forming the contact pads includes electroplating a lower layer and an upper layer with no middle layer.

Figure 7F:
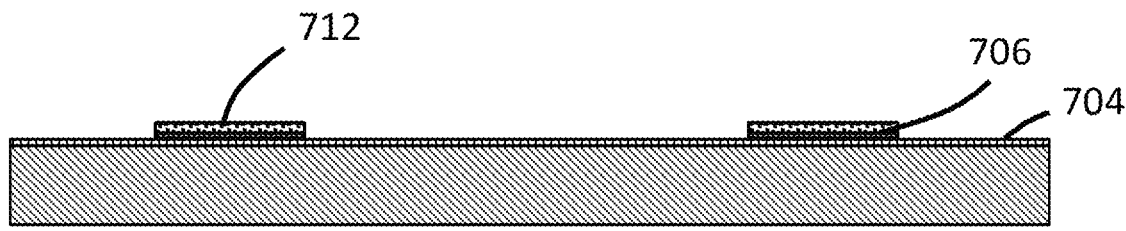
FIG. 7F is a schematic diagram depicting a portion of a bridge following the performance of a portion of the method shown in FIG. 6, in accordance with embodiments of the present disclosure.

In at least one embodiment of the present disclosure, once the contact pads have been formed, the pattern resist is removed. Such an embodiment is illustrated in FIG. 7F, wherein the pattern resist 708 has been removed, leaving the contact pads 712 exposed on the release layer 704 and seed layer 706.

Figure 7G:
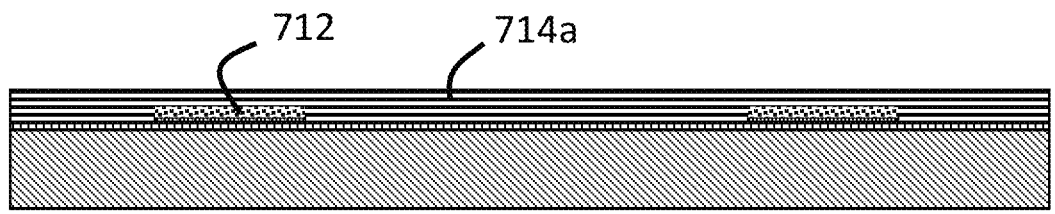
FIG. 7G is a schematic diagram depicting a portion of a bridge following the performance of a portion of the method shown in FIG. 6, in accordance with embodiments of the present disclosure.

At operation 604 of the method 600, the ultra-high density (UHD) circuitry of the HIAT bridge is formed. As discussed above, the UHD circuitry of the HIAT bridge can include layers of insulative material and layers of conductive material. Accordingly, as illustrated by FIGS. 7G-7AD, in at least one embodiment of operation 604, forming the UHD circuitry includes building layers of insulative material and conductive material in ways that may be known in the art.

More specifically, in accordance with at least one embodiment of the present disclosure, performing operation 604 of the method 600 may include repeatedly performing the following set of processes: (i) forming an insulative layer; (ii) selectively exposing and developing the insulative layer; (iii) forming a seed layer; (iv) forming a pattern resist; (v) selectively exposing and developing the pattern resist; (vi) electroplating copper; (vii) removing the pattern resist; and (viii) removing the seed layer to build the desired UHD circuitry of the HIAT bridge.

More specifically, in at least one embodiment of the present disclosure, in process (i), wherein the insulative layer is formed, the insulative layer can be a photosensitive resin. In at least one embodiment of the present disclosure, the insulative layer can be formed by spin coating. In at least one embodiment of the present disclosure, the insulative layer can be applied as a film. In such embodiments, the insulative layer can be made by a lamination process. In at least one embodiment of the present disclosure, the insulative layer can be applied as a liquid.

In accordance with at least one embodiment of the present disclosure, in process (ii), wherein the insulative layer is selectively exposed and developed, openings are formed for subsequent selective placement of the seed layer, pattern resist, and copper in processes (iii), (iv), and (v). In at least one embodiment of the present disclosure, the insulative layer can be exposed and developed using positive masking. In at least one embodiment of the present disclosure, the insulative layer can be exposed and developed using negative masking.

In accordance with at least one embodiment of the present disclosure, process (iii) includes forming the seed layer in substantially the same manner as described above with reference to operation 602 and FIG. 7B. Similarly, in accordance with at least one embodiment of the present disclosure, processes (iv) and (v) include forming the pattern resist in substantially the same manner as described above with reference to operation 602 and FIG. 7C and exposing and developing the pattern resist in substantially the same manner as described above with reference to operation 602 and FIG. 7D.

Similarly, in accordance with at least one embodiment of the present disclosure, process (vi) includes electroplating copper in substantially the same manner as described above with reference to electroplating metal materials to form contact pads in the performance of operation 602, the result of which is illustrated in FIG. 7E. Additionally, in accordance with at least one embodiment of the present disclosure, processes (vii) and (viii) include removing the pattern resist and removing the seed layer in substantially the same manner as described above with reference to operation 602 and FIG. 7F.

Figure 7H:
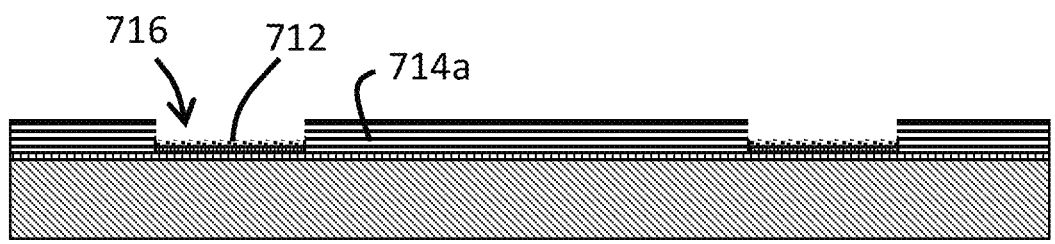
FIG. 7H is a schematic diagram depicting a portion of a bridge following the performance of a portion of the method shown in FIG. 6, in accordance with embodiments of the present disclosure.
Figure 7I:
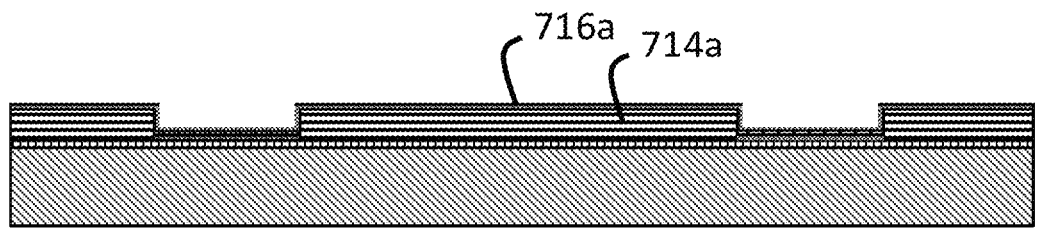
FIG. 7I is a schematic diagram depicting a portion of a bridge following the performance of a portion of the method shown in FIG. 6, in accordance with embodiments of the present disclosure.
Figure 7J:
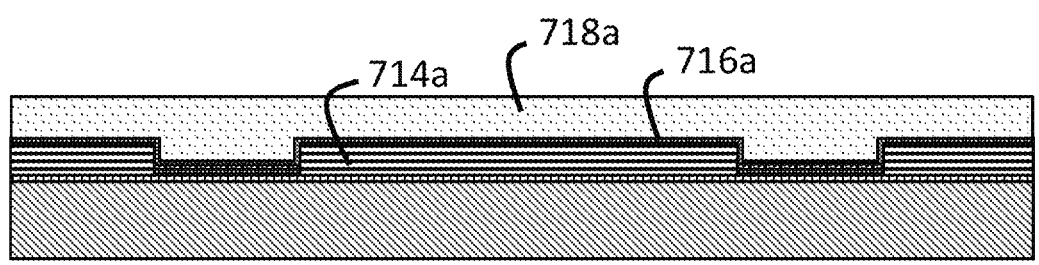
FIG. 7J is a schematic diagram depicting a portion of a bridge following the performance of a portion of the method shown in FIG. 6, in accordance with embodiments of the present disclosure.
Figure 7K:
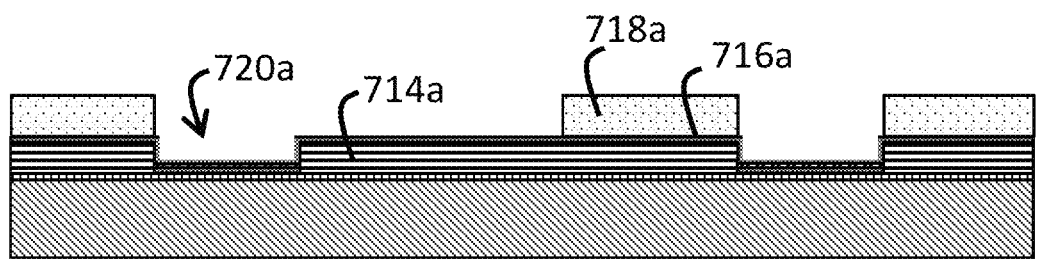
FIG. 7K is a schematic diagram depicting a portion of a bridge following the performance of a portion of the method shown in FIG. 6, in accordance with embodiments of the present disclosure.
Figure 7L:
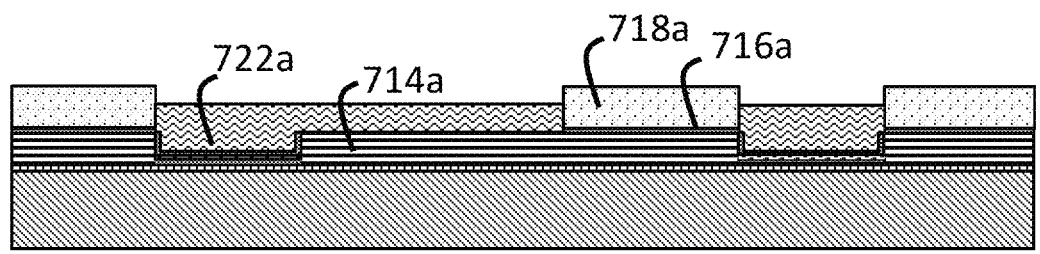
FIG. 7L is a schematic diagram depicting a portion of a bridge following the performance of a portion of the method shown in FIG. 6, in accordance with embodiments of the present disclosure.
Figure 7M:
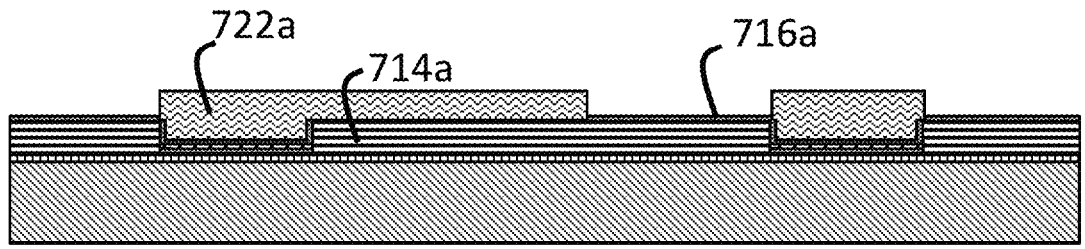
FIG. 7M is a schematic diagram depicting a portion of a bridge following the performance of a portion of the method shown in FIG. 6, in accordance with embodiments of the present disclosure.
Figure 7N:
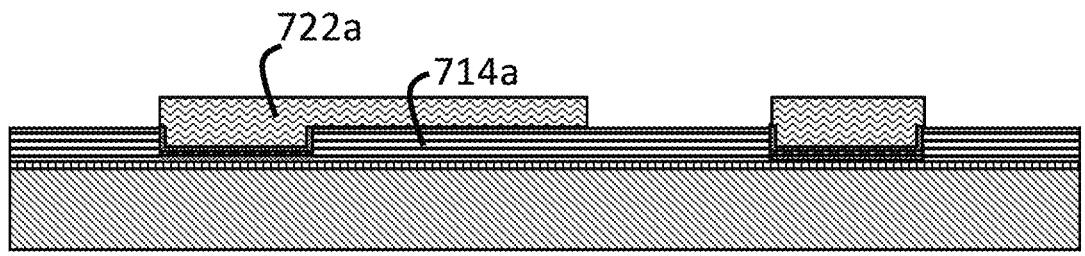
FIG. 7N is a schematic diagram depicting a portion of a bridge following the performance of a portion of the method shown in FIG. 6, in accordance with embodiments of the present disclosure.
Figure 7O:
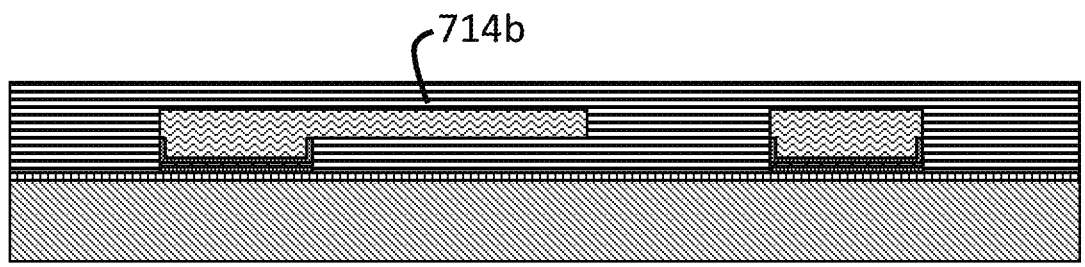
FIG. 7O is a schematic diagram depicting a portion of a bridge following the performance of a portion of the method shown in FIG. 6, in accordance with embodiments of the present disclosure.
Figure 7P:
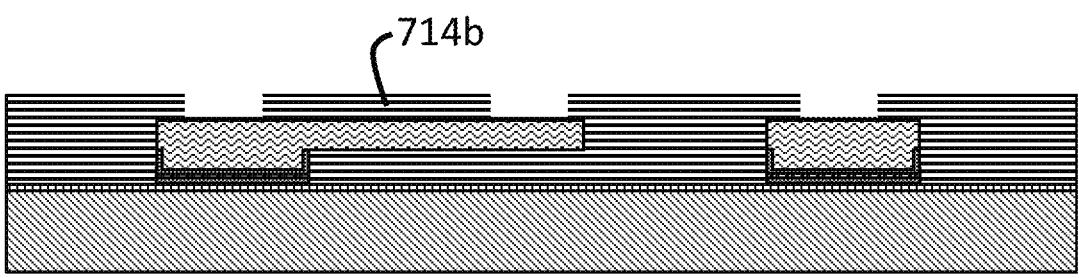
FIG. 7P is a schematic diagram depicting a portion of a bridge following the performance of a portion of the method shown in FIG. 6, in accordance with embodiments of the present disclosure.
Figure 7Q:
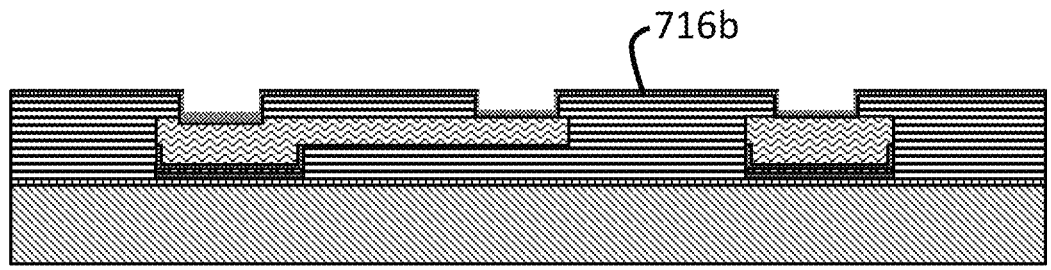
FIG. 7Q is a schematic diagram depicting a portion of a bridge following the performance of a portion of the method shown in FIG. 6, in accordance with embodiments of the present disclosure.
Figure 7R:
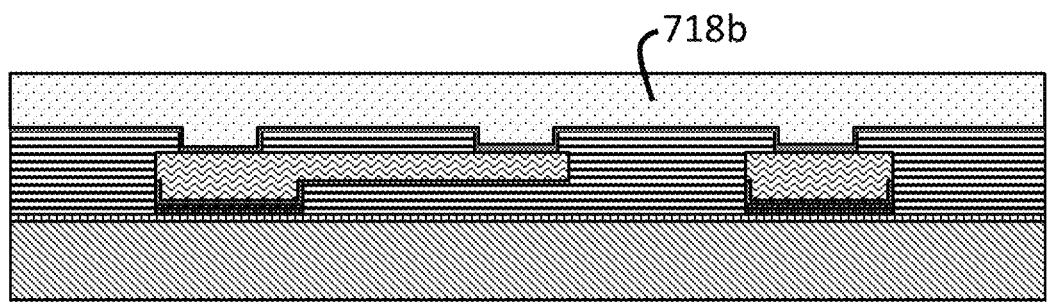
FIG. 7R is a schematic diagram depicting a portion of a bridge following the performance of a portion of the method shown in FIG. 6, in accordance with embodiments of the present disclosure.
Figure 7S:
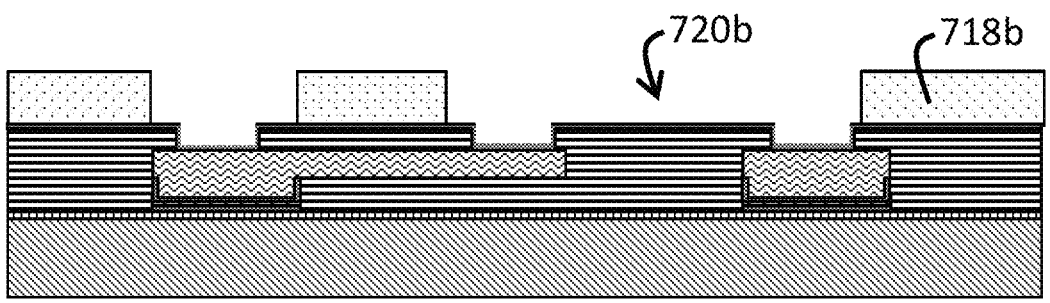
FIG. 7S is a schematic diagram depicting a portion of a bridge following the performance of a portion of the method shown in FIG. 6, in accordance with embodiments of the present disclosure.
Figure 7T:
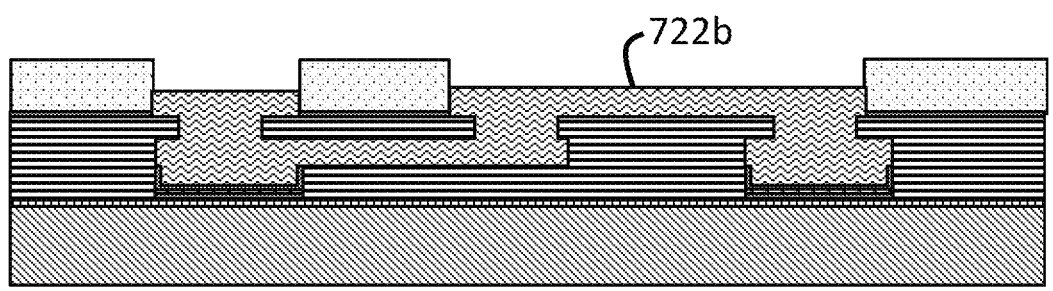
FIG. 7T is a schematic diagram depicting a portion of a bridge following the performance of a portion of the method shown in FIG. 6, in accordance with embodiments of the present disclosure.
Figure 7U:
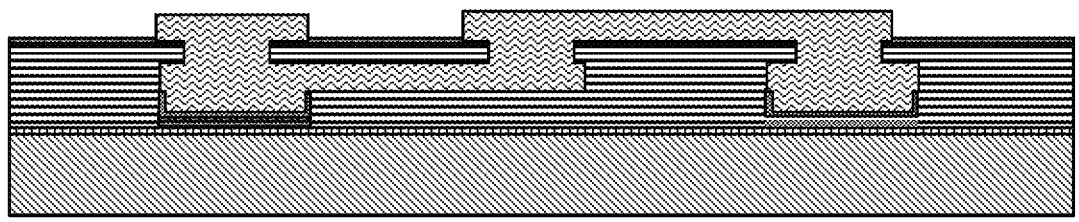
FIG. 7U is a schematic diagram depicting a portion of a bridge following the performance of a portion of the method shown in FIG. 6, in accordance with embodiments of the present disclosure.
Figure 7V:
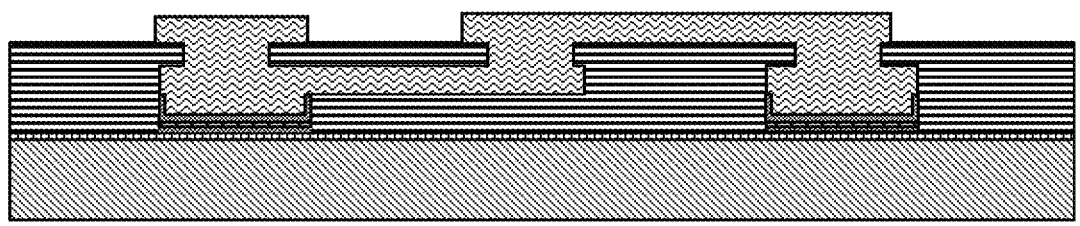
FIG. 7V is a schematic diagram depicting a portion of a bridge following the performance of a portion of the method shown in FIG. 6, in accordance with embodiments of the present disclosure.

As an illustrative example of the performance of operation 604, the results of successive performances of process (i), wherein the insulative layer is formed, are illustrated in FIGS. 7G, 7O, 7W, and 7AD. The results of successive performances of process (ii), wherein the insulative layer is selectively exposed and developed, are illustrated in FIGS. 7H, 7P, 7X, and FIG. 7AE. The results of successive performances of process (iii), wherein the seed layer is formed, are illustrated in FIGS. 7I, 7Q, and 7Y. The results of successive performances of process (iv), wherein a pattern resist is formed, are illustrated in FIGS. 7J and 7R. The results of successive performances of process (v), wherein the pattern resist is selectively exposed and developed, are illustrated in FIGS. 7K, 7S, and 7Z. The results of successive performances of process (vi), wherein copper is electroplated, are illustrated in FIGS. 7L, 7T, and 7AA. The results of successive performances of process (vii), wherein the pattern resist is removed, are illustrated in FIGS. 7M, 7U, and 7AB. The results of successive performances of process (viii), wherein the seed layer is removed, are illustrated in FIGS. 7N, 7V, and 7AC.

In particular, FIG. 7G illustrates the result of the formation of the insulative layer 714a. FIG. 7H illustrates the result of the selective exposure and development of insulative layer 714a. FIG. 7I illustrates the result of the formation of the seed layer 716a. FIG. 7J illustrates the result of the formation of pattern resist 718a. FIG. 7K illustrates the result of the selective exposure and development of pattern resist 718a to form openings 720a. FIG. 7L illustrates the result of electroplating copper 722a. FIG. 7M illustrates the result of removing the pattern resist 718a. FIG. 7N illustrates the result of removing the seed layer 716a.

The processes are then repeated to add another layer of selectively placed conductive and insulative materials. In particular, FIG. 7O illustrates the result of the formation of the insulative layer 714b. FIG. 7P illustrates the result of the selective exposure and development of insulative layer 714b. FIG. 7Q illustrates the result of the formation of the seed layer 716b. FIG. 7R illustrates the result of the formation of pattern resist 718b. FIG. 7S illustrates the result of the selective exposure and development of pattern resist 718b to form openings 720b. FIG. 7T illustrates the result of electroplating copper 722b. FIG. 7U illustrates the result of removing the pattern resist 718b. FIG. 7V illustrates the result of removing the seed layer 716b.

Figure 7W:
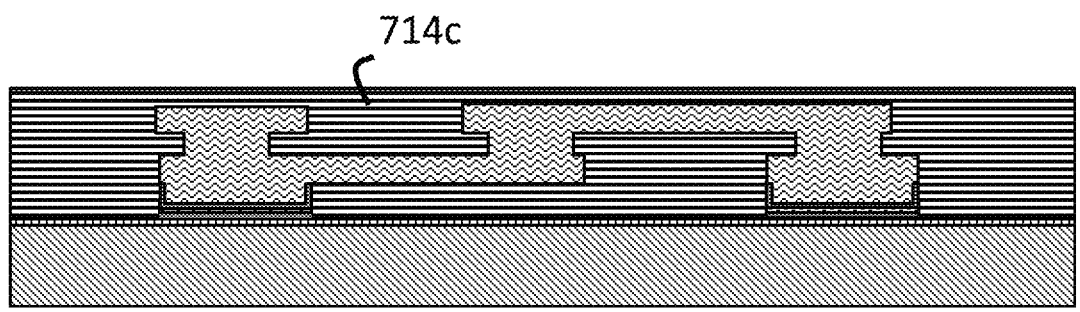
FIG. 7W is a schematic diagram depicting a portion of a bridge following the performance of a portion of the method shown in FIG. 6, in accordance with embodiments of the present disclosure.
Figure 7X:
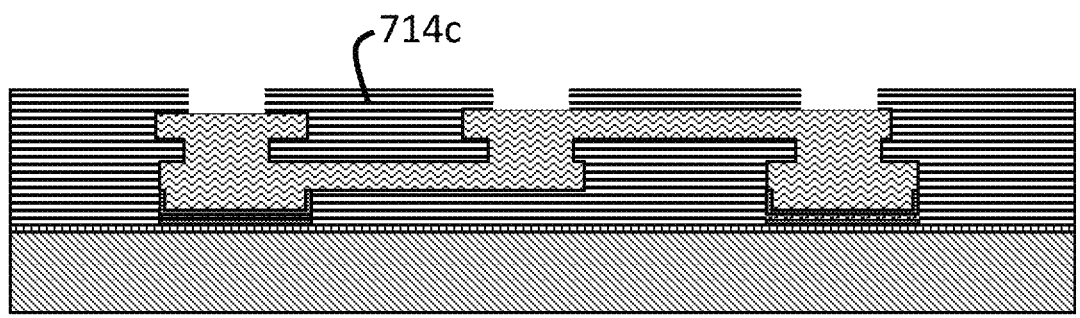
FIG. 7X is a schematic diagram depicting a portion of a bridge following the performance of a portion of the method shown in FIG. 6, in accordance with embodiments of the present disclosure.
Figure 7Y:
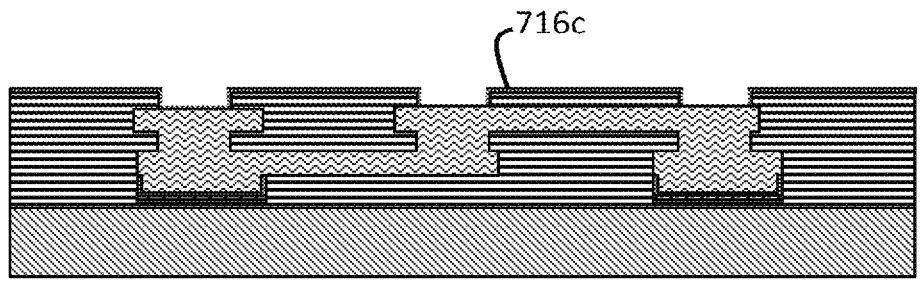
FIG. 7Y is a schematic diagram depicting a portion of a bridge following the performance of a portion of the method shown in FIG. 6, in accordance with embodiments of the present disclosure.
Figure 7Z:
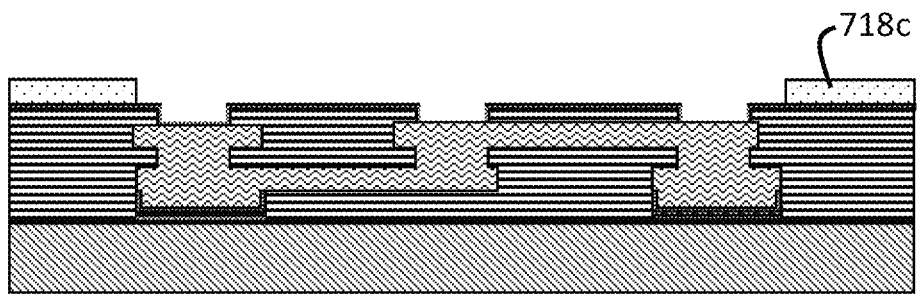
FIG. 7Z is a schematic diagram depicting a portion of a bridge following the performance of a portion of the method shown in FIG. 6, in accordance with embodiments of the present disclosure.
Figure 7A:
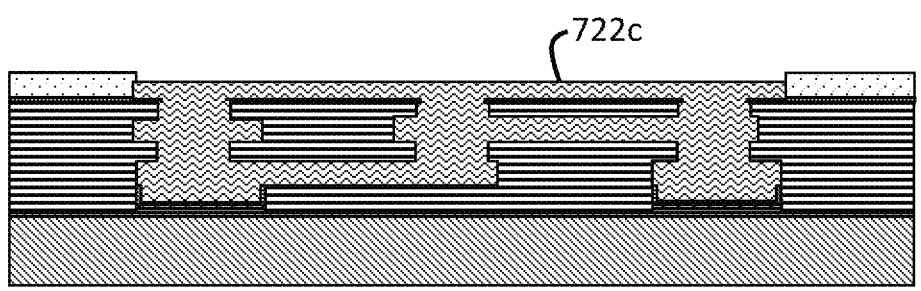
Figure 7A:
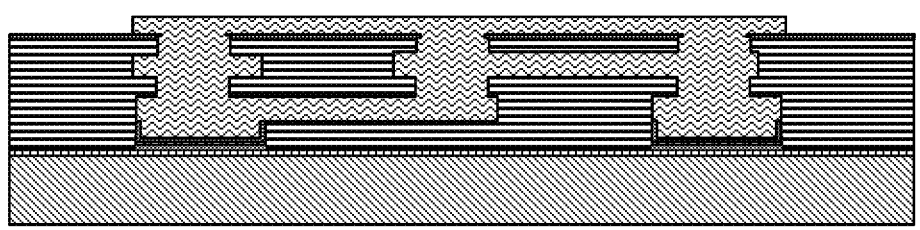
Figure 7A:
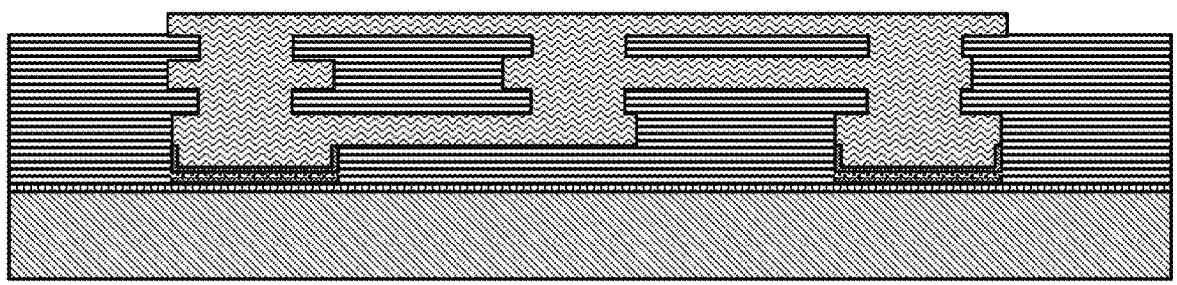
Figure 7A:
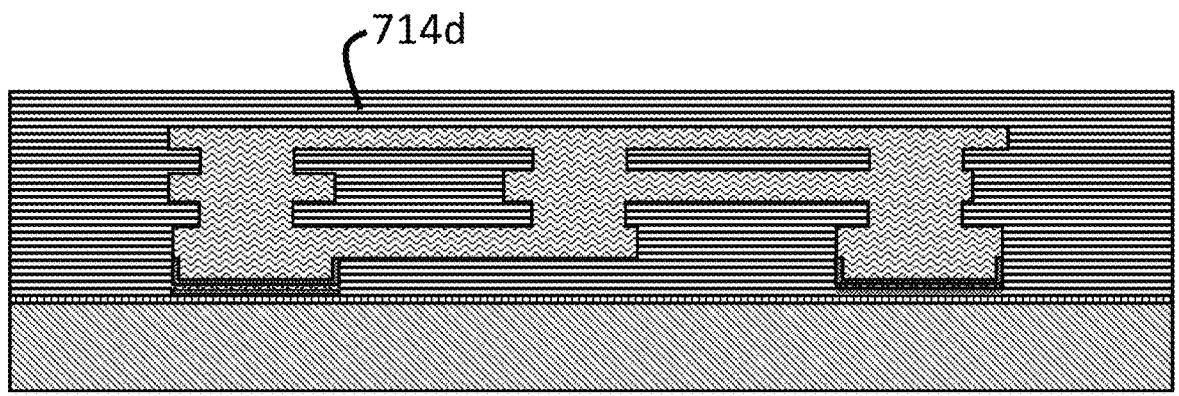
Figure 7A:
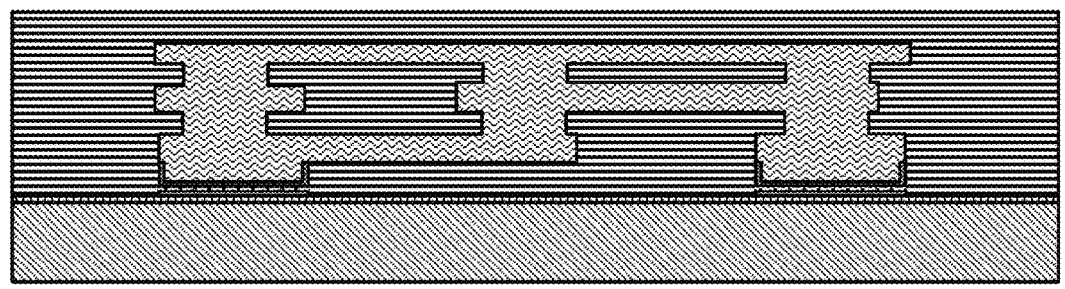
Figure 7A:
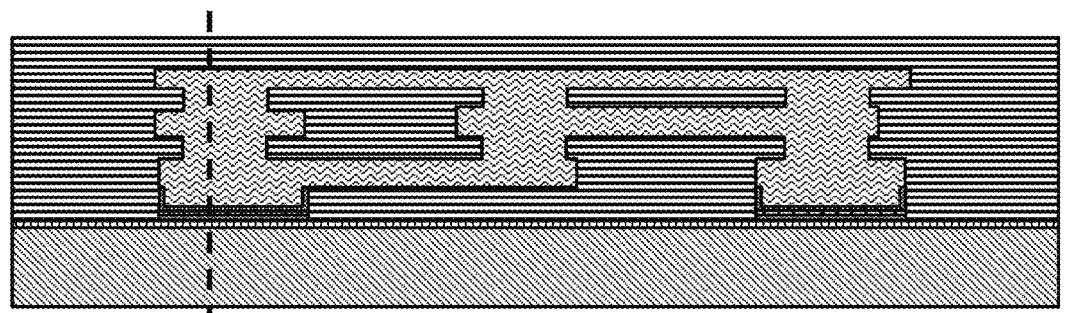
Figure 7A:
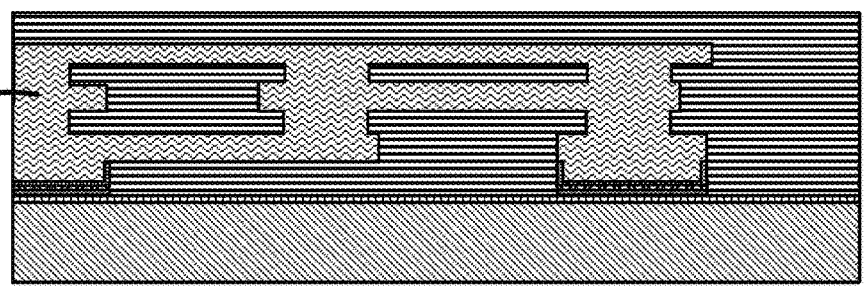

FIG. 7W illustrates the result of the formation of the insulative layer 714c. FIG. 7X illustrates the result of the selective exposure and development of insulative layer 714c. FIG. 7Y illustrates the result of the formation of the seed layer 716c. FIG. 7Z illustrates the result of the formation of pattern resist 718c and the selective exposure and development of pattern resist 718c. FIG. 7AA illustrates the result of electroplating copper 722c. FIG. 7AB illustrates the result of removing the pattern resist 718c. FIG. 7AC illustrates the result of removing the seed layer 716c.

FIG. 7AD illustrates the result of the formation of the final insulative layer 714d. FIG. 7AE illustrates the result of selectively exposing and developing the final insulative layer 714d. As illustrated by FIG. AE, the entirety of the final insulative layer 714d is selected for exposure and development such that all of the conductive layers are encapsulated by insulative layers at the completion of operation 604. FIG. AE illustrates a wafer 730 of the HIAT bridge including the desired UHD circuitry.

At operation 606, the side pad is exposed. In at least one embodiment of the present disclosure, the side pad is exposed by cutting or dicing the wafer such that a portion of the conductive layers of the UHD circuitry is exposed. In at least one embodiment of the present disclosure, it is possible to expose the side pad 750 by performing a roughening treatment instead of by dicing. The result of such dicing may be referred to as wafer singulation.

As shown in FIGS. 7L-7AG, the side pads 750 are formed together with the UHD circuitry. In other words, the side pads 750 are integrally formed with the UHD circuitry, including with the conductive material of the UHD circuitry. Because the side pads 750 are made of conductive material and are integrally formed with the UHD circuitry, including the conductive material of the UHD circuitry, the side pads 750 are electrically connected to the UHD circuitry.

FIG. 7AF indicates the location where the wafer 730 is to be cut with a dashed line, and FIG. 7AG illustrates the result of dicing the wafer 730 such that the side pad 750 of the UHD circuitry is exposed. The wafer 730 is one embodiment of the HIAT bridge disclosed herein. As shown, the side pad 750 is formed by cutting the wafer 730 to expose the conductive material of the HIAT bridge such that the side pad 750 forms an end face of the HIAT bridge wherein the conductive material of the HIAT bridge is exposed.

Figure 8:
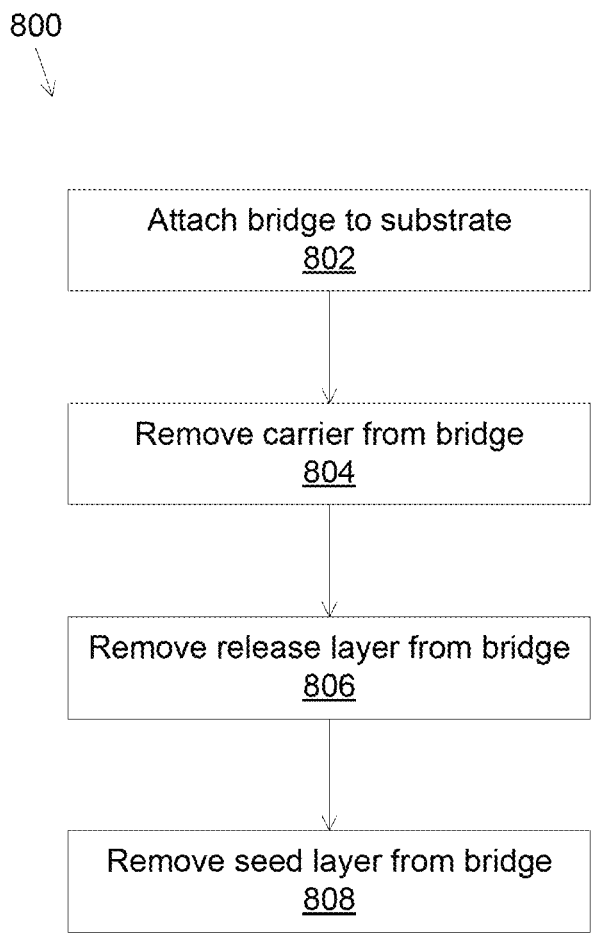
FIG. 8 depicts a flowchart of an example method of preparing a bridge, such as that shown in FIG. 2, for use in a package, in accordance with embodiments of the present disclosure.
Figure 9C:
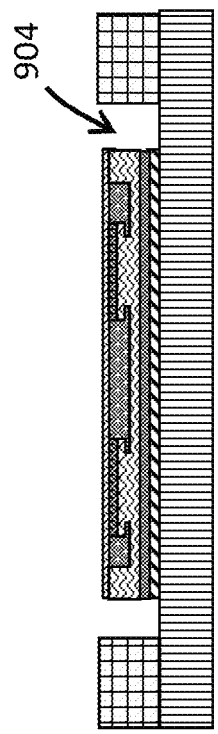
FIG. 9C is a schematic diagram depicting the bridge following the performance of a portion of the method shown in FIG. 8, in accordance with embodiments of the present disclosure.
Figure 9D:
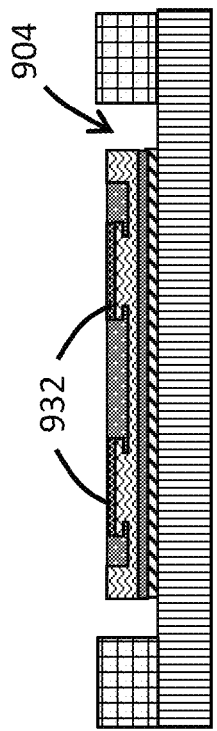
FIG. 9D is a schematic diagram depicting the bridge following the performance of a portion of the method shown in FIG. 8, in accordance with embodiments of the present disclosure.
Figure 9A:
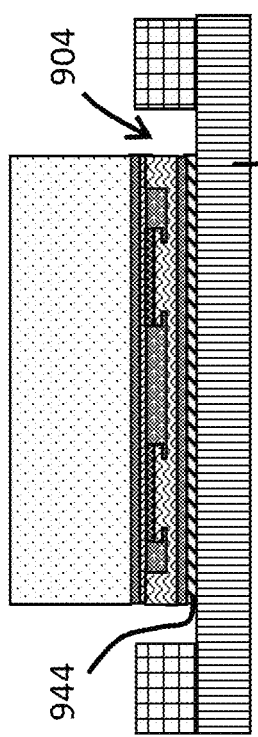
FIG. 9A is a schematic diagram depicting the bridge following the performance of a portion of the method shown in FIG. 8, in accordance with embodiments of the present disclosure.

FIG. 8 illustrates a flowchart for the attachment of the HIAT bridge and the release of the HIAT bridge from the carrier to prepare the HIAT bridge for integration into an IC package. The example method 800 begins at operation 802, wherein the HIAT bridge is attached to a laminate substrate with a curable adhesive. The result of operation 802 is illustrated in FIG. 9A, wherein the HIAT bridge 904 has been attached to a laminate substrate 916 by an adhesive 944 that is applied to the side of the HIAT bridge 904 opposite the side that is to be connected to chips. In accordance with at least one embodiment of the present disclosure, the HIAT bridge 904 can be substantially similar to the HIAT bridge 104, the laminate substrate 916 can be substantially similar to the substrate 116, and the adhesive 944 can be substantially similar to the adhesive 144 described above with reference to FIG. 2.

Figure 9B:
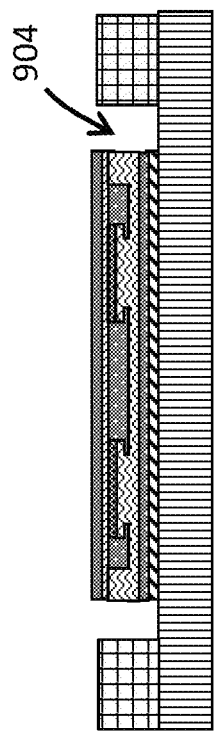
FIG. 9B is a schematic diagram depicting the bridge following the performance of a portion of the method shown in FIG. 8, in accordance with embodiments of the present disclosure.

At operation 804, the carrier is removed from the HIAT bridge. As discussed above with respect to operation 602 and FIG. 7A, the carrier can be a glass wafer. In such embodiments, the glass wafer carrier can be removed by, for example, laser ablation. In some alternative embodiments of the present disclosure the carrier can be a silicon wafer. In such embodiments, a mechanical or thermal de-bond process may be used to remove the carrier from the HIAT bridge. The result of operation 804 is illustrated in FIG. 9B, wherein the carrier has been removed from the HIAT bridge 904.

At operation 806, the release layer is removed from the HIAT bridge. As discussed above with respect to operation 602 and FIG. 7A, the HIAT bridge can be coupled to the carrier by a release layer, which may be, for example, a de-bond material. In some embodiments, the release layer can be removed by performing, for example, an $Ar/O_2$ plasma procedure. The result of operation 806 is illustrated in FIG. 9C, wherein the release layer has been removed from the HIAT bridge 904.

At operation 808, the seed layer is removed from the HIAT bridge. As discussed above with respect to operation 602 and FIG. 7B, the seed layer can include a layer of titanium and a layer of copper. In some embodiments, the seed layer can be removed by performing, for example, an etching procedure. The result of operation 808 is illustrated in FIG. 9D, wherein the seed layer is removed from the HIAT bridge 904 such that the contact pads 932 are exposed. In accordance with at least one embodiment of the present disclosure, the contact pads 932 are substantially similar to the conductive pads 132 described above with reference to FIG. 2. FIG. 9D illustrates an example HIAT bridge 904 that has been prepared for integration into an IC package by the performance of the example method 800.

The procedures, processes, and operations listed above provide an example of fabrication processes which may be used to form the HIAT bridge package disclosed herein. In alternative embodiments of the present disclosure, the results of the procedures listed above, which are illustrated in FIGS. 7A-7AG and 9A-9D, can be achieved by the performance of other known procedures.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be accomplished as one step, executed concurrently, substantially concurrently, in a partially or wholly temporally overlapping manner, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting of the various embodiments. As used herein, the singular forms "a," "an," and "the" are intended to include the plural forms as well, unless the context clearly indicates otherwise. It will be further understood that the terms "includes" and/or "including," when used in this specification, specify the presence of the stated features, integers, steps, operations, elements, and/or components, but do not preclude the presence or addition of one or more other features, integers, steps, operations, elements, components, and/or groups thereof. In the previous detailed description of example embodiments of the various embodiments, reference was made to the accompanying drawings (where like numbers represent like elements), which form a part hereof, and in which is shown by way of illustration specific example embodiments in which the various embodiments may be practiced. These embodiments were described in sufficient detail to enable those skilled in the art to practice the embodiments, but other embodiments may be used and logical, mechanical, electrical, and other changes may be made without departing from the scope of the various embodiments. In the previous description, numerous specific details were set forth to provide a thorough understanding the various embodiments. But, the various embodiments may be practiced without these specific details. In other instances, well-known circuits, structures, and techniques have not been shown in detail in order not to obscure embodiments.

As used herein, "a number of" when used with reference to items, means one or more items. For example, "a number of different types of networks" is one or more different types of networks.

When different reference numbers comprise a common number followed by differing letters (e.g., 100*a*, 100*b*, 100*c*) or punctuation followed by differing numbers (e.g., 100-1, 100-2, or 100.1, 100.2), use of the reference character only without the letter or following numbers (e.g., 100) may refer to the group of elements as a whole, any subset of the group, or an example specimen of the group.

Further, the phrase "at least one of," when used with a list of items, means different combinations of one or more of the listed items can be used, and only one of each item in the list may be needed. In other words, "at least one of" means any combination of items and number of items may be used from the list, but not all of the items in the list are required. The item can be a particular object, a thing, or a category.

For example, without limitation, "at least one of item A, item B, or item C" may include item A, item A and item B, or item B. This example also may include item A, item B, and item C or item B and item C. Of course, any combinations of these items can be present. In some illustrative examples, "at least one of" can be, for example, without limitation, two of item A; one of item B; and ten of item C; four of item B and seven of item C; or other suitable combinations.

In the foregoing, reference is made to various embodiments. It should be understood, however, that this disclosure is not limited to the specifically described embodiments. Instead, any combination of the described features and elements, whether related to different embodiments or not, is contemplated to implement and practice this disclosure. Many modifications, alterations, and variations may be apparent to those of ordinary skill in the art without departing from the scope and spirit of the described embodiments. Furthermore, although embodiments of this disclosure may achieve advantages over other possible solutions or over the prior art, whether or not a particular advantage is achieved by a given embodiment is not limiting of this disclosure. Thus, the described aspects, features, embodiments, and advantages are merely illustrative and are not considered elements or limitations of the appended claims except where explicitly recited in a claim(s). Additionally, it is intended that the following claim(s) be interpreted as covering all such alterations and modifications as fall within the true spirit and scope of the invention.

What is claimed is:

1. An integrated circuit package, comprising:
 a substrate including at least one electrical connection to at least one of power or ground; and
 a bridge structure coupled to the substrate, the bridge structure including:
  a bridge-chip interconnect made of conductive material,
  at least one layer of conductive material in direct contact with the bridge-chip interconnect and electrically connected to the at least one electrical connection of the substrate,
  at least one layer of insulative material,
  a side pad made of conductive material forming an end face of the bridge structure such that the side pad is in direct contact with the at least one layer of conductive material and with the at least one layer of insulative material, and
an additional connection made of conductive material and arranged in direct contact with the side pad and with the bridge-chip interconnect, the additional connection separated from the at least one layer of conductive material by the at least one layer of insulative material and electrically connects only the side pad and the bridge-chip interconnect.

2. The integrated circuit package of claim 1, wherein:
the side pad is electrically connected to the at least one electrical connection of the substrate by solder.

3. The integrated circuit package of claim 1, wherein:
the side pad is integrally formed with the at least one layer of conductive material.

4. The integrated circuit package of claim 1, wherein:
the end face of the bridge structure is covered by solder.

5. The integrated circuit package of claim 1, wherein:
the additional connection is arranged so as to extend in a direction substantially parallel to the at least one layer of conductive material.

6. The integrated circuit package of claim 1, wherein:
the additional connection has a width that is between approximately 10 micrometers and approximately 20 micrometers.

7. The integrated circuit package of claim 1, wherein:
the bridge structure further includes a further bridge-chip interconnect arranged such that the bridge-chip interconnect is arranged between the further bridge-chip interconnect and the side pad, and
the additional connection does not extend from the side pad to the further bridge-chip interconnect.

8. The integrated circuit package of claim 1, wherein:
the additional connection is integrally formed with the side pad and with the bridge-chip interconnect.

9. The integrated circuit package of claim 1, wherein:
the additional connection has a length that extends from a center of the side pad to a center of the bridge-chip interconnect, and
the length is approximately 40 micrometers.

10. The integrated circuit package of claim 1, wherein:
the additional connection is arranged at a depth beneath an uppermost surface of the bridge structure, and
the depth is approximately 10 micrometers.

11. The integrated circuit package of claim 10, wherein:
the additional connection has a thickness that extends in a direction parallel to the depth, and
the thickness is between approximately 5 micrometers and approximately 10 micrometers.

12. A bridge structure for use in an integrated circuit package, the bridge structure comprising:
a bridge-chip interconnect made of conductive material;
at least one layer of conductive material in direct contact with the bridge-chip interconnect and configured to be electrically connected to at least one electrical connection of a substrate;
at least one layer of insulative material;
a side pad made of conductive material that is in direct contact with the at least one layer of conductive material and with the at least one layer of insulative material, the side pad forming an end face of the bridge structure such that the conductive material of the side pad is exposed; and
an additional connection made of conductive material and arranged in direct contact with the side pad and with the bridge-chip interconnect, the additional connection separated from the at least one layer of conductive material by the at least one layer of insulative material and electrically connects only the side pad and the bridge-chip interconnect.

13. The bridge structure of claim 12, wherein:
the side pad is integrally formed with the at least one layer of conductive material.

14. The bridge structure of claim 12, wherein:
the end face of the bridge structure is in direct contact with solder.

15. The bridge structure of claim 12, wherein:
the additional connection extends in a direction substantially parallel to the at least one layer of conductive material.

16. The bridge structure of claim 12, wherein:
the additional connection is integrally formed with the side pad and with the bridge-chip interconnect.

17. The bridge structure of claim 12, further comprising:
a further bridge-chip interconnect structure arranged such that the bridge-chip interconnect is arranged between the further bridge-chip interconnect and the side pad,
wherein the side pad is not electrically connected to the further bridge-chip interconnect through the additional connection.

18. A method of forming a bridge structure for an integrated circuit package, the method comprising:
forming contact pads;
forming ultra-high density circuitry that is electrically connected to the contact pads, the ultra-high density circuitry including at least one layer of conductive material and a bridge-chip interconnect that is in direct contact with the at least one layer of conductive material;
exposing a side pad made of electrically conductive material, the side pad being integrally formed with the ultra-high density circuitry; and
forming an additional connection made of conductive material between the side pad and the bridge-chip interconnect such that the additional connection is separated from the at least one layer of conductive material by a layer of insulative material and electrically connects only the side pad and the bridge-chip interconnect.

19. The method of claim 18, wherein:
the additional connection is formed extending in a direction substantially parallel to the at least one layer of conductive material.

* * * * *